United States Patent [19]

Nishihara

[11] Patent Number: 5,795,792
[45] Date of Patent: Aug. 18, 1998

[54] METHOD OF MANUFACTURING A SEMICONDUCTOR DEVICE HAVING A TRENCH STRUCTURE

[75] Inventor: Hidenori Nishihara, Hyogo, Japan

[73] Assignee: Mitsubishi Denki Kabushiki Kaisha, Tokyo, Japan

[21] Appl. No.: 644,874

[22] Filed: May 10, 1996

Related U.S. Application Data

[62] Division of Ser. No. 359,142, Dec. 19, 1994, Pat. No. 5,541,425.

[30] Foreign Application Priority Data

Jan. 20, 1994 [JP] Japan .................. 6-004417
Mar. 25, 1994 [JP] Japan .................. 6-056157

[51] Int. Cl.[6] .............................. H01L 21/8232
[52] U.S. Cl. .............. 437/6; 437/24; 437/72; 437/203
[58] Field of Search .............. 437/6, 24, 65, 437/66, 67, 68, 72, 203

[56] References Cited

U.S. PATENT DOCUMENTS

| | | | |
|---|---|---|---|
| 4,326,332 | 4/1982 | Kenny | 257/330 |
| 4,407,058 | 10/1983 | Fatula, Jr. et al. | 437/38 |
| 4,918,503 | 4/1990 | Okuyama | 257/301 |
| 4,931,409 | 6/1990 | Nakajima et al. | 437/67 |
| 5,168,331 | 12/1992 | Yilmaz | 257/331 |
| 5,306,940 | 4/1994 | Yamazaki | 257/398 |
| 5,321,289 | 6/1994 | Baba et al. | 257/331 |
| 5,436,189 | 7/1995 | Beasom | 437/67 |
| 5,506,167 | 4/1996 | Chen et al. | 437/24 |
| 5,578,508 | 11/1996 | Baba et al. | 437/67 |

FOREIGN PATENT DOCUMENTS

| | | |
|---|---|---|
| 0016520 A3 | 10/1980 | European Pat. Off. . |
| 0675529 A2 | 10/1995 | European Pat. Off. . |
| 3837762 A1 | 5/1989 | Germany . |
| 3838355 C2 | 5/1990 | Germany . |
| 60-111439 | 6/1985 | Japan . |
| 61-288428 | 12/1986 | Japan . |
| 63-45848 | 2/1988 | Japan . |
| 63-56951 | 3/1988 | Japan . |
| 63-79329 | 4/1988 | Japan .................. 437/24 |
| 63-115358 | 5/1988 | Japan . |
| 63-133561 | 6/1988 | Japan . |
| 63-166230 | 7/1988 | Japan . |
| 63-287024 | 11/1988 | Japan . |
| 64-57623 | 3/1989 | Japan . |
| 1-216538 | 8/1989 | Japan . |
| 2-3956 | 1/1990 | Japan . |
| 3-34541 | 2/1991 | Japan . |
| 2011710 | 7/1979 | United Kingdom . |

OTHER PUBLICATIONS

Wolf et al "Silicon Processing for the VLSI Era", vol. 1, pp. 540–542, 1986.
IBM Technical Disclosure Bulletin, "High Density Cross Point Semiconductor Memory Cell," vol. 30, No. 7, Dec., 1987.

*Primary Examiner*—Michael Trinh
*Attorney, Agent, or Firm*—Lowe, Price, LeBlanc & Becker

[57] ABSTRACT

A trench is formed on a main surface of a p+ type monocrystalline silicon substrate. A silicon oxide film is formed extending from the inner surface of trench onto the main surface of p+ type monocrystalline silicon substrate. The thickness of a corner portion positioned on the upper end corner portion of the sidewall of trench in silicon oxide film is larger than the thickness of silicon oxide film positioned on the sidewall of trench. An n type polycrystalline silicon layer extending from the inside of trench onto the main surface of p+ type monocrystalline silicon substrate is formed on silicon oxide film. Thus, a semiconductor device having a trench structure with an improved breakdown voltage for an insulating layer positioned on an upper end corner portion of the sidewall of a trench is obtained.

4 Claims, 35 Drawing Sheets

METHOD OF MANUFACTURING A SEMICONDUCTOR DEVICE HAVING A TRENCH STRUCTURE

This application is a division of application Ser. No. 08/359,142 filed Dec. 19, 1994, now U.S. Pat. No. 5,541,425.

BACKGROUND OF THE INVENTION

1. Field of the Invention

The present invention relates generally to semiconductor devices having a trench structure with a Conductive layer buried in a trench provided in a main surface of a semiconductor substrate with an insulating layer therebetween and manufacturing methods thereof, and more specifically, to a semiconductor device having a trench structure with the above insulating layer and conductive layer formed to extend from the inside of a trench provided in a main surface of a semiconductor substrate to a prescribed region on the main surface of the semiconductor substrate and a manufacturing method thereof.

2. Description of the Background Art

In recent years, there have been demands for reduction of chip sizes and improvement of performances in semiconductor devices having a trench structure. Trench widths must be reduced accordingly. If a trench width is reduced too much, however, it would be difficult to directly form a contact in the conductive layer buried in the trench. It is therefore a generally practiced approach to lead out the conductive layer to be buried in the trench from the inside of the trench to the surface of the semiconductor substrate for contact with an input/output terminal electrode on the surface of the semiconductor substrate.

An insulated gate bipolar transistor having a trench structure (hereinafter simply referred to as "IGBT") will be described as an example of a semiconductor device having such a trench structure in which a conductive layer is led out from the inside of a trench to a semiconductor substrate surface. FIG. 44 is a plan view showing an IGBT having a conventional trench structure.

Referring to FIG. 44, a plurality of trenches 113 are provided in a prescribed region in a main surface of a substrate (not shown). The n type emitter diffusion layers 106 are provided between prescribed regions of trenches 113. An emitter electrode 111 is formed on n type diffusion layers 106. Emitter electrode 111 and n type emitter diffusion layers 106 are electrically connected through contact portions 115.

An n type polycrystalline silicon layer 108 is formed buried in a trench 113 and extending from the inside of trench 113 to the main surface of the substrate. A gate electrode 111a is formed partially overlapping n type polycrystalline silicon layer 108. Gate electrode 111a and n type polycrystalline silicon layer 108 are electrically connected through a contact portion 114.

Now, a cross section of the IGBT having such a plan view structure will be described. FIG. 45 is a cross sectional view taken along line Y2—Y2 in FIG. 44. FIG. 46 is a cross sectional view taken along line Y1—Y1 in FIG. 44. FIG. 47 is a cross sectional view taken along line Y3—Y3.

With reference to these three cross sectional views, the structure of the IGBT will be described in more detail. Referring to FIG. 45, formed on a main surface of a p+ type monocrystalline silicon substrate 101 are an n+ type silicon epitaxial layer 102, an n− type silicon epitaxial layer 103, and a p type diffusion layer 104. These stacked layers form a substrate. A collector electrode 112 is formed on the back surface of p+ type monocrystalline silicon substrate 101.

On the main surface of the substrate, trench 113 having a bottom in n− type silicon epitaxial layer 103 and p type diffusion layer 104. A silicon oxide film 107 is formed on the inner surface of trench 113 and on the surface of p type diffusion layer 104. The n type polycrystalline silicon layer 108 is formed on the surface of silicon oxide film 107, extending from the inside of trench 113 onto the surface of p type diffusion layer 104.

An interlayer insulating layer 109 is formed covering the surfaces of n type polycrystalline silicon layer 108 and p type diffusion layer 104. A barrier metal layer 110 is formed on a prescribed region of the surface of interlayer insulating layer 109. Emitter electrode 111 is formed on barrier metal layer 110. In interlayer insulating layer 109, an opening portion is provided in a prescribed region on the extension of n type polycrystalline silicon layer 108 on the surface of p type diffusion layer 104. Barrier metal layer 110 and electrode 111a described above are formed in the opening portion. Thus, contact portion 114 for gate electrode 111a and n type polycrystalline silicon layer 108 is formed.

Now, referring to FIG. 46, the structure of another cross section of the above IGBT will be described. Referring to FIG. 46, a p type base diffusion layer 105 is formed in a prescribed region of n− type silicon epitaxial layer 103. The n type emitter diffusion layer 106 is formed on p type base diffusion layer 105. The n type emitter diffusion layer 106 and emitter electrode 111 are electrically connected through contact portion 115.

On the sidewall of trench 113, as illustrated in FIG. 46, n type emitter diffusion layer 106, p type base diffusion layer 105, and then n− type silicon epitaxial layer 103 are sequentially formed. Thus formed MOS transistor has on the sidewall of trench 113 n type polycrystalline silicon layer 108 as a gate electrode, n type emitter diffusion layer 106 as a source region, and n− type silicon epitaxial layer 103 as a drain region.

Now, referring to FIG. 47, the structure of yet another cross section of the above IGBT will be described. Referring to FIG. 47, p type diffusion layer 104 described above is formed linked to p type base diffusion layer 105. n type emitter diffusion layer 106 is formed on p type base diffusion layer 105. The n type emitter diffusion layer 106 is electrically connected to emitter electrode 111 through contact portion 115.

The operation of the conventional IGBT will be briefly described in conjunction with FIG. 46. Referring to FIG. 46, as described above, n channel MOS transistor is formed on the sidewall of trench 113 in the IGBT.

The n channel MOS transistor has n type polycrystalline silicon layer 108 functioning as a gate, silicon oxide film 107 functioning as a gate insulating layer, and n type emitter region 106 and n− type silicon epitaxial layer 103 functioning as source/drain regions. The operation of the IGBT will be controlled by the n channel MOS transistor.

The operation of the above IGBT until it is turned on will be described. In order to turn on IGBT, a prescribed positive potential is applied to a collector electrode 112, emitter electrode 111 is connected to ground, and a prescribed positive potential is applied to n type polycrystalline silicon layer 108.

The n channel MOS transistor is thus turned on. Electrons are then injected into n− type silicon epitaxial layer 103. At the time, since the positive potential is applied to collector electrode 112, holes are introduced into n– type silicon epitaxial layer 103 from the inside of p+ type silicon polycrystalline substrate 101.

Then, the above electrons and holes are recombined in n– type silicon epitaxial layer 103. Current is thus made to flow from collector electrode 112 to emitter electrode 111. In other words, the IGBT is turned on.

The off state of the IGBT will be described. In order to turn off the IGBT, n type polycrystalline silicon layer 108 is kept from application of a potential for example. In such a case, the n channel MOS transistor is turned off. Thus, electrons are not supplied into n– type silicon epitaxial layer 103 unlike the above case. Thus, electrons and holes will not be recombined unlike the above case. As a result, current does not flow from collector electrode 112 to emitter electrode 111. In other words, the IGBT is turned off.

Referring to FIGS. 49 to 60, a method of manufacturing a conventional IGBT having the above-described structure will be described. FIGS. 49 to 54 are cross sectional views showing first to sixth steps in a process of manufacturing the conventional IGBT, with the cross sections corresponding to FIG. 45.

FIGS. 55 to 60 are cross sectional views showing the first to sixth steps in the process of manufacturing the conventional IGBT, with the cross sections corresponding to the cross section shown in FIG. 46.

Referring to FIGS. 49 to 55, n+ type monocrystalline silicon epitaxial layer 102 and n– type monocrystalline silicon epitaxial layer 103 are sequentially formed on a main surface of p+ type monocrystalline silicon substrate 101 through epitaxial growth. Note that for simplicity of description, the stacked layer structure of p+ type monocrystalline silicon substrate 101, n+ type monocrystalline silicon epitaxial layer 102, and n– type monocrystalline silicon epitaxial layer 103 will be hereinafter simply referred to as "substrate".

A silicon oxide film 118 is formed on the surface of n– type monocrystalline silicon epitaxial layer 103. p type diffusion layer 104 and p type base diffusion layer 105 are formed on the surface of n– type monocrystalline silicon epitaxial layer 103 by means of photolithography, p type impurity ion implantation, and impurity diffusion techniques.

Referring to FIGS. 50 and 56, by means of photolithography, n type impurity ion implantation, and impurity diffusion techniques, n type emitter diffusion layer 106 is formed on the surface of p type base diffusion layer 105. Then, a silicon oxide film 119 is formed on the entire surface of the main surface of the substrate by CVD (Chemical Vapor Deposition) or the like.

Referring to FIGS. 51 and 57, silicon oxide film 119 is patterned into a prescribed form by photolithography and etching. Using silicon oxide film 119 as mask, the main surface of the substrate is anisotropically etched. A trench 113 is formed in the main surface of the substrate as a result.

Referring to FIGS. 52 and 58, oxidation treatment is conducted in order to remove damages made at the time of silicon etching for forming trench 113 described above. An oxide film formed by the oxidation treatment (not shown) and silicon oxide film 119 described above are then removed away. Then, a silicon oxide film 107 to be a gate oxide film is formed by means of thermal oxidation.

At the time, as described in IEEE TRANSACTIONS ON ELECTRON DEVICES, VOL. ED-34, NO. 8, AUGUST, 1987, P.1681–P.1687, the upper end corner portion 117 of the sidewall of trench 113 has such a shape that the tip end forms an acute angle. The upper end corner portion 117 of the sidewall of trench 113 having such a shape is generally called "horn". FIG. 48 shows the horn (the upper end corner portion 117 of the sidewall of trench 113) being enlarged.

After silicon oxide film 107 is thus formed, polycrystalline silicon layer 108 containing an n type impurity is formed on the entire main surface of the substrate by CVD or the like.

Referring to FIGS. 53 and 59, resist 120 patterned into a prescribed shape is formed on n type polycrystalline silicon layer 108 by photolithography. Using patterned resist 120 as mask, n type polycrystalline silicon layer 108 is patterned.

At the time, n type polycrystalline silicon layer 108 is subjected to etching treatment for a relatively long period of time so that n type polycrystalline silicon layer 108 will not be left other than at a desired region on the main surface of the substrate. The upper surface of n type polycrystalline silicon layer 108 filling trench 113 is overetched and thus positioned below the main surface of the substrate.

Referring to FIGS. 54 and 60, after removal of patterned resist 120, interlayer insulating layer 109 is formed on the entire main surface of substrate by means of CVD.

Then, interlayer insulating layer 109 is patterned into a prescribed form by photolithography and etching, barrier metal layer 110 and emitter electrode 111 and gate electrode 111a formed of Al or the like are formed in a prescribed region on interlayer insulating layer 109. Collector electrode 112 is formed on the back surface of p+ type monocrystalline silicon substrate 101. Through the above steps, the conventional IGBT shown in FIGS. 44 to 47 is formed.

The IGBT having the conventional trench structure described above is however encountered with the following problems. As illustrated in FIG. 48, the oxidation treatment for removal of damages formed at the time of silicon etching after formation of trench 113 and the oxidation treatment for forming silicon oxide film 107 produce horn 117 at the upper end corner portion of the sidewall of trench 113.

The shape of horn 117 is such a shape that the tip end portion substantially makes an acute angle. The thickness t of silicon oxide film 107 on horn 117 will be smaller than the thickness t1 of silicon oxide film 107 positioned on the sidewall of trench or on the surface of p type diffusion layer 104.

The n type polycrystalline silicon layer 108 is formed to cover such horn 117 and silicon oxide film 107. The n type polycrystalline silicon layer 108 which functions as a gate is supplied with a prescribed potential.

At the time, with horn 117 of such a shape, an electric field between n type polycrystalline silicon layer 108 to be a gate and the substrate is concentrated in the vicinity of horn 117. In addition, the thickness t of silicon oxide film 107 positioned on horn 117 is thin. As a result, the breakdown voltage of silicon oxide film 107 is greatly reduced in the vicinity of the region to form horn 117.

The following two approaches have been suggested for preventing the breakdown voltage of silicon oxide film 107 from being reduced.

The first approach is disclosed in IEEE TRANSACTIONS ON ELECTRON DEVICES, VOL. ED-34, NO. 8, AUGUST, 1987, P.1681–P.1687. The first approach is based on oxidation conditions of silicon. More specifically, according to the above document, it is described that horn 117 as described above is not formed at an oxidation temperature as high as about 1100° C., and the upper end corner portion on the sidewall of trench 113 is rounded.

Thus rounding the upper end corner portion on the sidewall of trench 113 relaxes the concentration of electric field at the portion, and the breakdown voltage of silicon oxide film 107 positioned on the upper end corner portion of the sidewall of trench 113 can be improved.

According to the first approach, however, oxidation is conducted at a temperature as high as about 1100° C. as described above, and therefore the structure of an impurity diffusion layer which has been previously formed can change.

Meanwhile, the second approach for improving the breakdown voltage of silicon oxide film 107 at the upper corner portion of the sidewall of trench 113 is disclosed in Japanese Patent Laying-Open Nos. 64-57623, 63-166230 or the like. These documents disclose a method of rounding such an upper end corner portion on the sidewall of trench 113 by means of chemical dry etching. However, thus simply rounding the upper end corner portion on the sidewall trench 113 has a limit in the effect of relaxing electrical field intensity without increasing the size of devices. The reason will be described in conjunction with FIG. 61.

FIG. 61 is a graph showing calculation results of the intensities of electric fields at the flat portion and the corner portion. In FIG. 61, the abscissa represents radius of curvature (r)/oxide film thickness ($T_{ox}$) at the corner portion, while the ordinate represents electric field intensity (Er) at the corner portion/electric field intensity (Ep) at the flat portion.

Referring to FIG. 61, for an oxide film thickness of 0.1 μm and a radius of curvature at the corner portion of 0.34 μm, the electric field intensity at the corner portion is 1.25 times as large as that at the flat portion. As illustrated in FIG. 61, in order to further relax the electric field intensity, the radius of curvature r of the corner portion must be increased. Thus increasing the radius of curvature (r) of the corner portion can impair reduction of the size of devices.

In view of the above, simply rounding upper end corner portion on the sidewall of trench 113 has its limit in improving the breakdown voltage of an insulating layer (silicon oxide film) positioned on the upper end corner portion of the sidewall of the trench without increasing the size of the device.

Note that it might be possible to secure the breakdown voltage at the upper end corner portion of the sidewall of trench 113 by increasing the thickness of silicon oxide film 107 besides the above first and second approaches. Silicon oxide film 107 however functions as a gate insulating layer for the MOS transistor for driving the IGBT, and therefore cannot be increased in thickness more than a necessary level. Therefore, it would also be difficult to improve the breakdown voltage of silicon oxide film 107 positioned on the upper end corner portion of the sidewall of trench 113 by this method.

SUMMARY OF THE INVENTION

The present invention is directed to a solution to such problems. It is an object of the invention to provide a semiconductor device having a trench structure permitting improvement of the breakdown voltage of an insulating layer on an upper end corner portion of the sidewall of a trench without increasing the size of device, and a manufacturing method thereof.

Another object of the invention is to provide a semiconductor device having a trench structure permitting improvement of the breakdown voltage of an insulating layer on an upper end corner portion of the sidewall of a trench while keeping change of the structure of an impurity diffusion layer at a small level, and a manufacturing method thereof.

Yet another object of the invention is to provide a semiconductor device having a trench structure permitting improvement of the breakdown voltage of an insulating layer on an upper end corner portion of the sidewall of a trench without increasing the number of steps included in the manufacture, and a manufacturing method thereof.

A semiconductor device having a trench structure according to the present invention includes a semiconductor substrate having a main surface, a trench formed in the main surface of the semiconductor substrate, an insulating layer, and a conductive layer. The insulating layer is formed extending from the top of the inner surface of the trench to the top of the main surface of the semiconductor substrate. The conductive layer is formed on the insulating layer and extending from the inside of the trench to the main surface of the semiconductor substrate. The thickness of the insulating layer positioned on the upper end corner portion of the sidewall of the trench covered by the conductive layer is made larger than the thickness of the insulating layer positioned on the sidewall of the trench other than at the upper end corner portion.

According to the semiconductor device having the trench structure according to the present invention, the thickness of the insulating layer positioned on the upper end corner portion of the sidewall of the trench covered by the conductive layer is made larger than the thickness of the insulating layer positioned on the sidewall of the trench excluding the upper end corner portion. Thus, regardless of the shape of the upper end corner portion of the sidewall of the trench, the breakdown voltage of the insulating layer positioned on the upper end corner portion of the sidewall of the trench can be improved. In addition, the breakdown voltage of the insulating layer positioned on the upper end corner portion of the sidewall of the trench can be improved even more by rounding the upper end corner portion of the sidewall of the trench, and the upper end corner portion of the sidewall of the trench does not have to be rounded as much as the case according to the second approach described above. Accordingly, the breakdown voltage of the insulating layer positioned on the upper end corner portion of the sidewall of the trench can effectively be improved without increasing the size of the device as much as the case according to the second approach.

According to a method of manufacturing a semiconductor device having a trench structure according to the present invention, in one aspect, an impurity is implanted into a prescribed region of a main surface of a semiconductor substrate to form an impurity implanted region. Note that the impurity herein is defined as a substance externally introduced into the semiconductor substrate by some method. Therefore, if a substance of the same kind as the semiconductor substrate is introduced into the semiconductor substrate, the substance is interpreted herein as an impurity.

Then, a mask layer patterned into a prescribed form is formed on the main surface of the semiconductor substrate so as to partially overlap the impurity implanted region. Using the mask layer as mask, the main surface of the semiconductor substrate is anisotropically etched, and a trench penetrating through part of the impurity implanted region is formed. The mask layer is then removed away. Then, the entire main surface of the semiconductor substrate is thermally oxidized and an oxide film is formed on the main surface of the semiconductor substrate. A conductive layer extending from the inside of the trench to the top of the main surface of the semiconductor substrate is formed on the oxide film.

According to the method of manufacturing a semiconductor device having a trench structure according to the present invention, in one aspect, the mask layer is formed partially overlapping the impurity implanted region. The trench is formed using the mask layer as mask. Thus, the impurity implanted region partially remains at the upper end corner portion of the sidewall of the trench. Thermal oxidation treatment is conducted in this state.

At the time, in the impurity implanted region, the crystallinity of the semiconductor substrate is disturbed by the impurity implantation. Therefore, the thermal oxidation treatment for forming the oxide film causes proliferous oxidation in the surface of the impurity implanted region. As a result, an oxide film having a relatively large thickness is formed at the surface of the impurity implanted region. Thus, a semiconductor device having a trench structure with an improved breakdown voltage of an oxide film at the upper end corner portion of the sidewall of the trench is obtained.

Furthermore, upon forming the oxide film, thermal oxidation treatment at a high temperature (about 1100° C.) as the case according to the conventional first approach is not necessary. Changes in the structure of the impurity diffusion layer previously formed can be restrained to a small level.

Furthermore, when the impurity implanted region is formed, another impurity region to be formed on the main surface of the semiconductor substrate may be formed simultaneously with the impurity implanted region by appropriately selecting the impurity. Such a case can be coped with by simply changing the mask pattern for forming another impurity region. Thus, the impurity implanted region can be formed without increasing the number of steps in the manufacture. Increase in the manufacturing costs can be prevented.

According to the method of manufacturing a semiconductor device having a trench structure according to the present invention, in another aspect, a mask layer to expose a prescribed region of a main surface of a semiconductor substrate is formed on the main surface of the semiconductor substrate. Using the mask layer as mask, an impurity is implanted into the prescribed region on the main surface of the semiconductor substrate. Subjecting the impurity to diffusion treatment, an impurity region extending below the mask layer is formed in the main surface of the semiconductor substrate. Using the mask layer as mask, anisotropic etching treatment is conducted to form a trench penetrating through part of the impurity region on the main surface of the semiconductor substrate. Then the mask layer is removed away. Then the entire main surface of the semiconductor substrate is thermally oxidized to form an oxide film on the entire main surface of the semiconductor substrate. A conductive layer extending from the inside of the trench to the top of the main surface of the semiconductor substrate is formed on the oxide film.

According to the method of manufacturing a semiconductor device having a trench structure according to the present invention, in another aspect, the impurity region extending below the mask layer is formed by diffusion treatment of the impurity after implanting the impurity into a prescribed region of the main surface of the semiconductor substrate using the mask layer. At the time, the diffusion treatment for diffusing the impurity may be a usual diffusion treatment for forming an impurity region. Therefore, change in the structure of another impurity region previously formed can be restrained at a small level.

Then, the trench is formed using the mask layer as mask. Therefore, the impurity region can be partially left on the upper end corner portion of the sidewall of the trench. Therefore, as is the case with the above, proliferous oxidation is caused at the upper end corner portion of the sidewall of the trench when the oxide film is formed. Thus, the thickness of the oxide film positioned on the upper end corner portion of the sidewall of the trench can be made larger than the thickness of the oxide film formed simultaneously on the other region. Therefore a semiconductor device having a trench structure with an improved breakdown voltage of the oxide film positioned on the upper end corner portion of the sidewall of the trench is obtained.

As is the case with the foregoing aspects, appropriately selecting the impurity makes it possible to form the above impurity region and another impurity region formed on the main surface of the semiconductor substrate in a single step. As is the case with the above aspects, a semiconductor device having a trench structure with an improved breakdown voltage of an oxide film on the upper end corner portion of the sidewall of the trench is obtained without increasing cost in the manufacture.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to FIGS. 1 to 43, embodiments of the present invention will be now described. Note that in the following description of embodiments, the concept of the present invention will be described by way of illustrating an application to an IGBT having a trench structure. The concept of the present invention is however applicable to other devices having a trench structure other than the IGBT having the trench structure. The present invention is particularly applicable to a semiconductor device having a substrate with a trench formed therein, and a conductive layer formed extending from the inside of the trench onto the top of the surface of the substrate with an insulating layer therebetween.

First Embodiment

Figure 1:
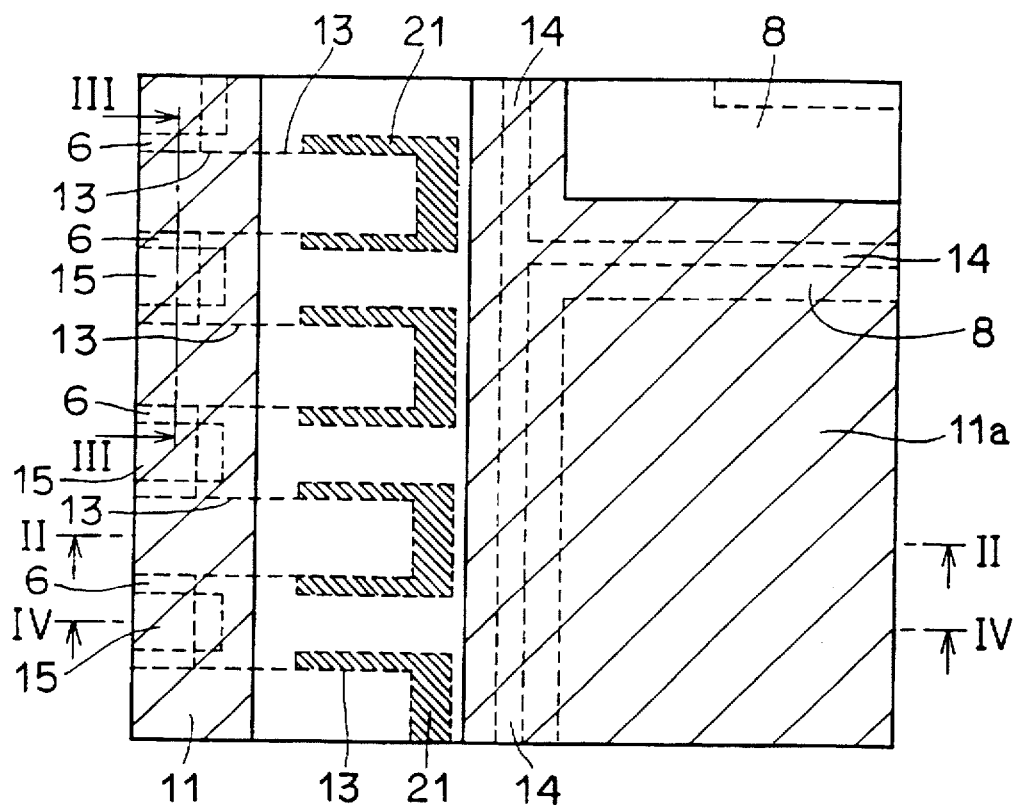
FIG. 1 is a plan view showing an IGBT according to a first embodiment of the invention.

Referring to FIGS. 1 to 12, a first embodiment of the invention will be described. FIG. 1 is a plan view showing an IGBT having a trench structure according to the first embodiment of the invention. Referring to FIG. 1, the structure of the IGBT in plane according to this embodiment is substantially similar to the structure of the conventional IGBT in plane with an essential difference being that an n type diffusion region 21 is formed. The n type diffusion region 21 is formed to surround a prescribed region of an upper end corner portion of a sidewall of trench 13.

Figure 44:
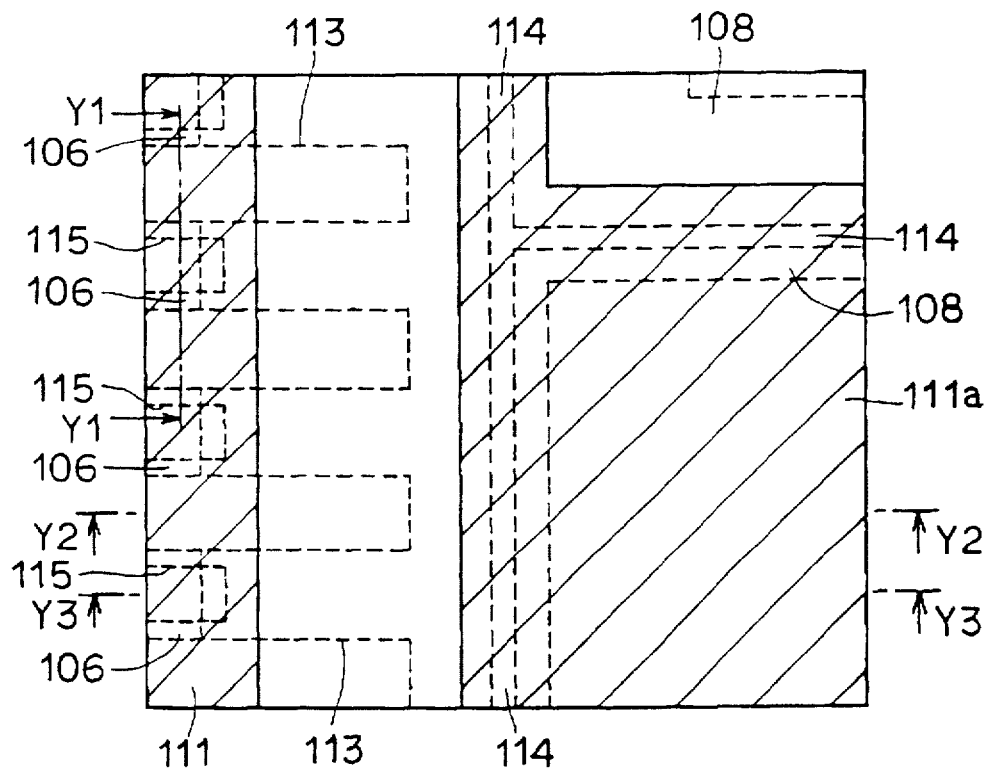
FIG. 44 is a plan view showing a conventional IGBT.
Figure 45:
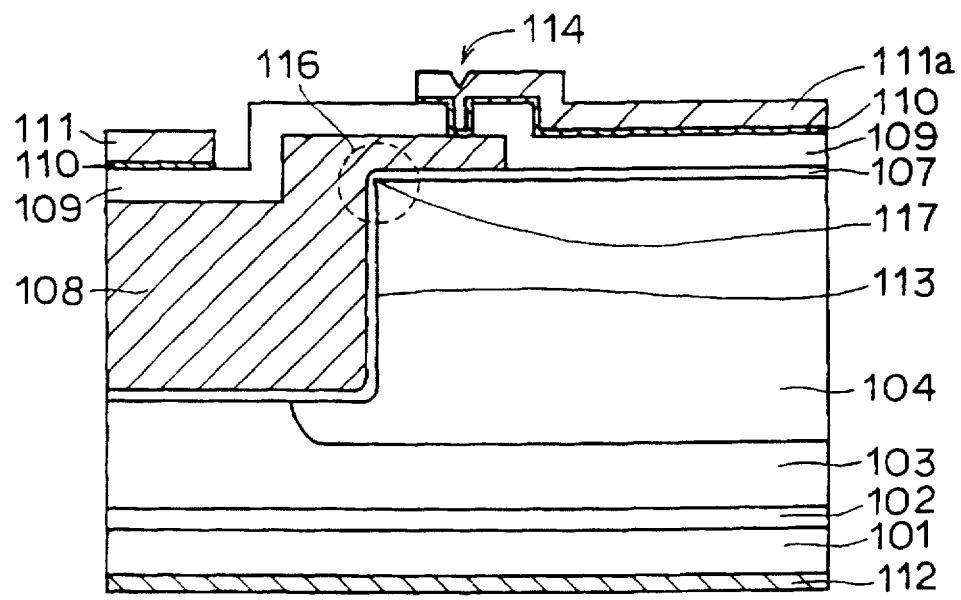
FIG. 45 is a cross sectional view taken along line Y2—Y2 in FIG. 44.
Figure 46:
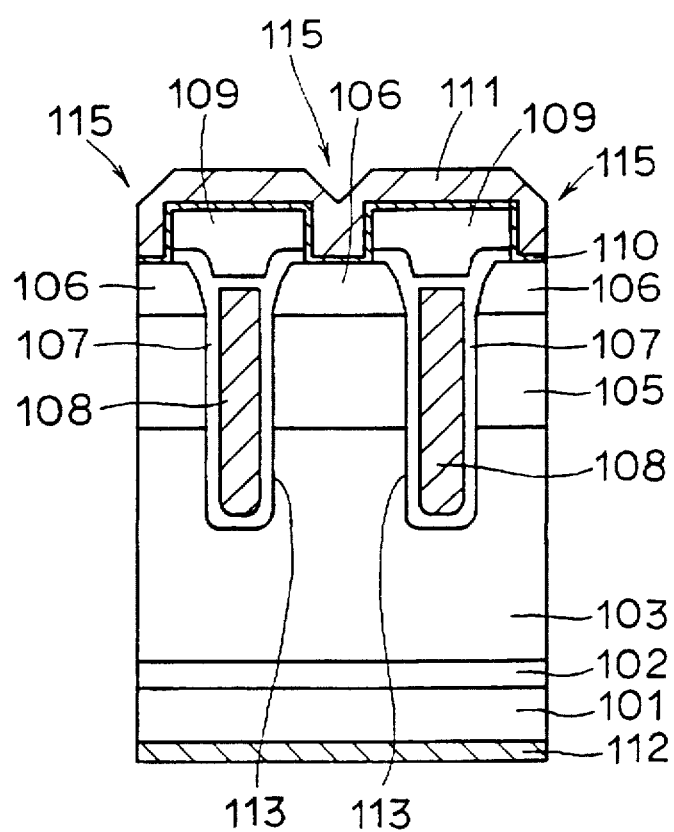
FIG. 46 is a cross sectional view taken along line Y1—Y1 in FIG. 44.
Figure 47:
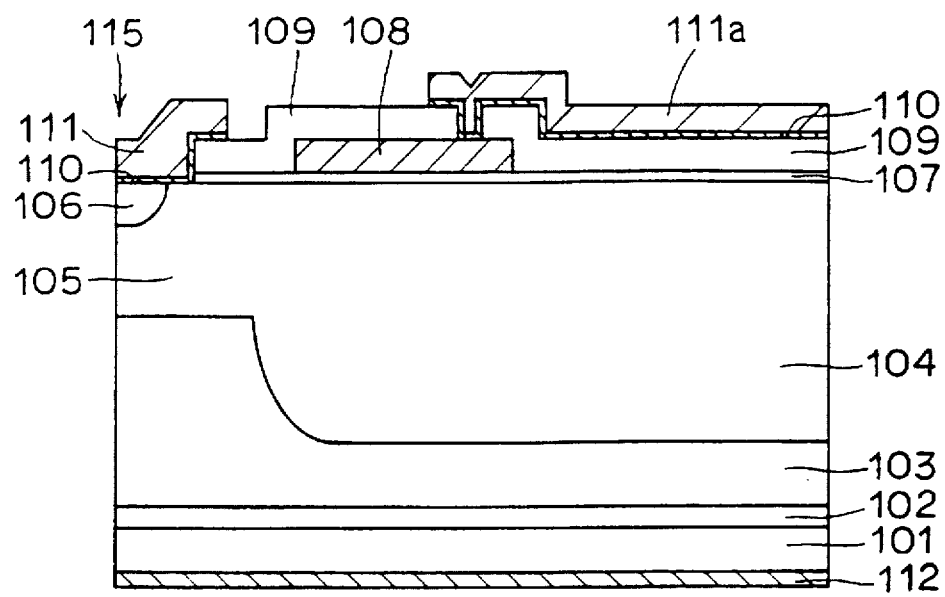
FIG. 47 is a cross sectional view taken along line Y3—Y3 in FIG. 44.

The other structure is similar to the conventional IGBT shown in FIG. 44. More specifically, a plurality of trenches 13 of a prescribed shape are formed at a main surface of a silicon substrate (not shown). An n type emitter diffusion layer 6 is formed close to a prescribed region of a sidewall of trench 13. An emitter electrode 11 formed of Al or the like is formed on n type emitter diffusion layer 6. Emitter electrode 11 and n type emitter diffusion layer 6 are electrically connected through a contact portion 15.

An n type polycrystalline silicon layer 8 is formed extending from the inside of trench 13 onto the top of the silicon substrate. Formed on n type polycrystalline silicon layer 8 are emitter electrode 11 described above and a gate electrode 11a a prescribed distance apart therefrom. Gate electrode 11a and n type polycrystalline silicon layer 8 are electrically connected through a contact portion 14.

Figure 2:
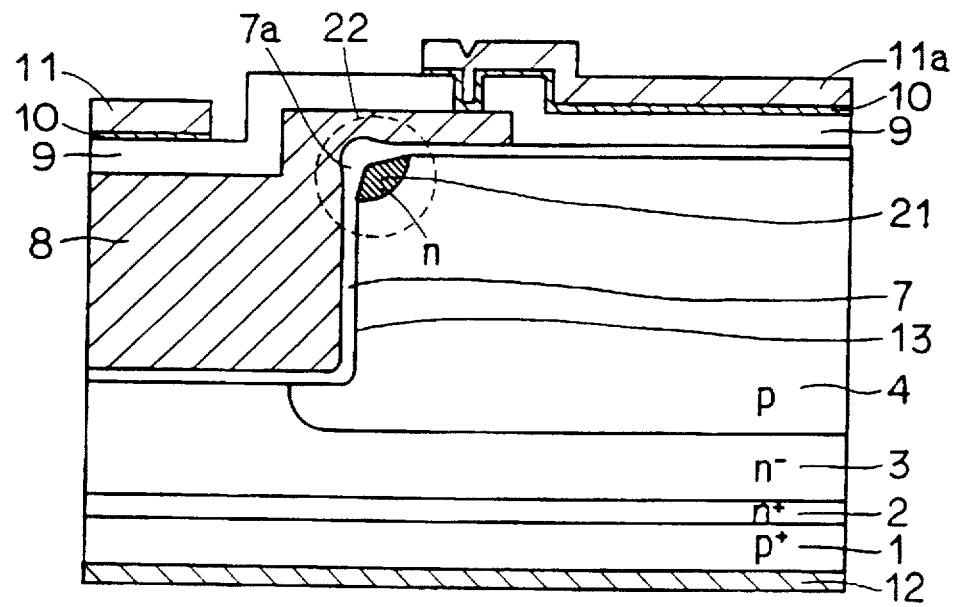
FIG. 2 is a cross sectional view taken along line II—II in FIG. 1.
Figure 3:
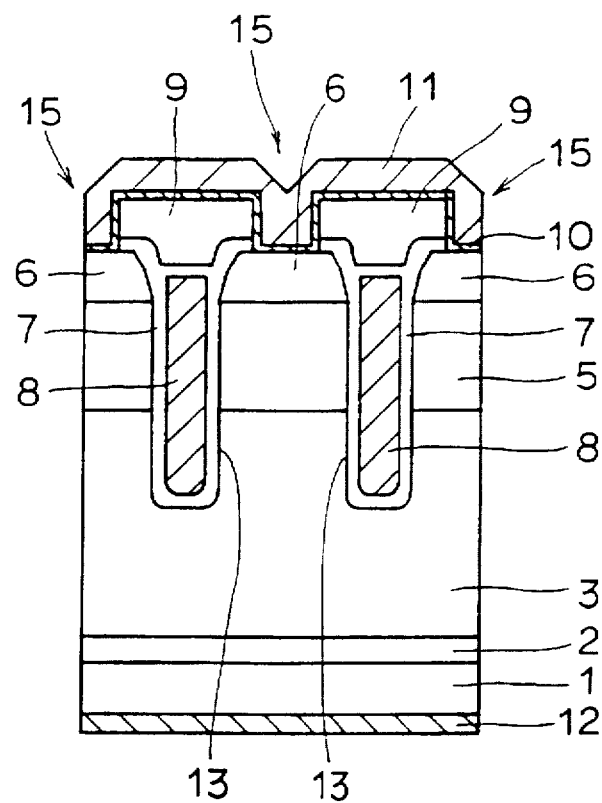
FIG. 3 is a cross sectional view taken along line III—III in FIG. 1.
Figure 4:
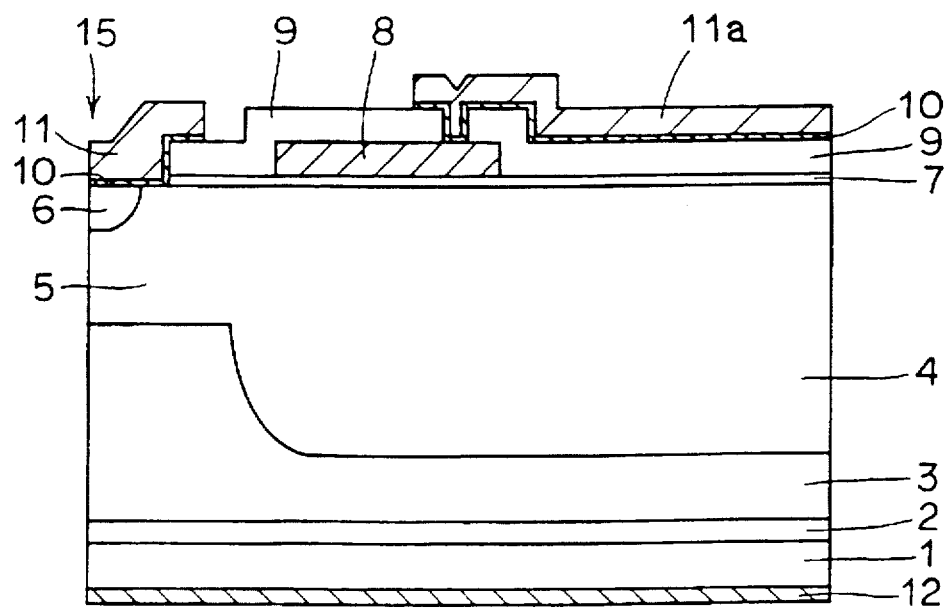
FIG. 4 is a cross sectional view taken along line IV—IV in FIG. 1.

Referring to FIGS. 2 to 4 a cross section of the IGBT according to the present embodiment having the top view shown in FIG. 1 will be described. FIG. 2 is a cross sectional view taken along line II—II in FIG. 1. FIG. 3 is a cross sectional view taken along line III—III in FIG. 1. FIG. 4 is a cross sectional view taken along line IV—IV in FIG. 1.

Referring to FIG. 2, formed on a main surface of a p+ type monocrystalline silicon substrate 1 are an n+ type silicon epitaxial layer 2, an n– type silicon epitaxial layer 3, and a p type diffusion layer 4. A collector electrode 12 is formed on the back surface of p+ type monocrystalline silicon substrate 1. For ease of description, a stacked structure of p+ type silicon substrate 1, n+ type silicon epitaxial layer 2, and n– type silicon epitaxial layer 3 will be referred simply as "silicon substrate".

At a main surface of the silicon substrate, a trench 13 having a prescribed depth is formed. On an upper end corner portion of a sidewall of trench 13, n type diffusion region 21 described above will be formed. Formed on the inner surface of trench 13 and the main surface of the silicon substrate is a silicon oxide film 7. With n type diffusion region 21 described above, the portion 7a positioned on the upper end corner portion of the sidewall of trench 13 (hereinafter simply referred to as "corner portion") in silicon oxide film 7 is formed thicker than silicon oxide film 7 positioned on the other sidewall portion of trench 13.

An n type polycrystalline layer 8 is formed on silicon oxide film 7 so as to extend from the inside of trench 13 onto the main surface of the silicon substrate. n type polycrystalline silicon layer 8 has a function as a gate electrode for an MOS transistor formed in a prescribed region on the sidewall portion of trench 13. At the time silicon oxide film 7 described above formed on the sidewall of trench 13 functions as a gate oxide film.

In the above case, since the thickness of corner portion 7a is larger than the thickness of silicon oxide film 7 positioned on the other region, the breakdown voltage of silicon oxide film 7 at the upper end corner portion of the sidewall of trench 13 can be improved. This makes it possible to effectively restrain current leakage between n type polycrystalline silicon layer 8 functioning as a gate electrode and the silicon substrate. As a result, an IGBT having a highly reliable trench structure is obtained.

An interlayer insulating layer 9 formed of a silicon oxide film or the like is formed to cover n type polycrystalline silicon layer 8 described above. In a prescribed region of interlayer insulating layer 9, an emitter electrode 11 and a gate electrode 11a formed of Al or the like are formed through a barrier metal layer 10.

Now, referring to FIG. 3, a cross section taken along line III—III in FIG. 1 will be described. Referring to FIG. 3, a p type base diffusion layer 5 is formed in a prescribed region on n− type silicon epitaxial layer 3. An n type emitter diffusion layer 6 will be formed on p type base diffusion layer 5. The n type emitter diffusion layer 6 will be a source region for an MOS transistor using n type polycrystalline silicon layer 8 described above as a gate. At the time, n− type silicon epitaxial layer 3 will be a drain region for the MOS transistor using n type polycrystalline silicon layer 8 as a gate.

Referring to FIG. 4, a cross section taken along line IV—IV in FIG. 1 will be now described. Referring to FIG. 4, p type diffusion layer 4 described above is formed linked to p type base diffusion layer 5. The n type emitter diffusion layer 6 is formed in a prescribed region in a surface of p type base diffusion layer 5. The n type emitter diffusion layer 6 is electrically connected to emitter electrode 11 through a contact portion 15.

Figure 5:
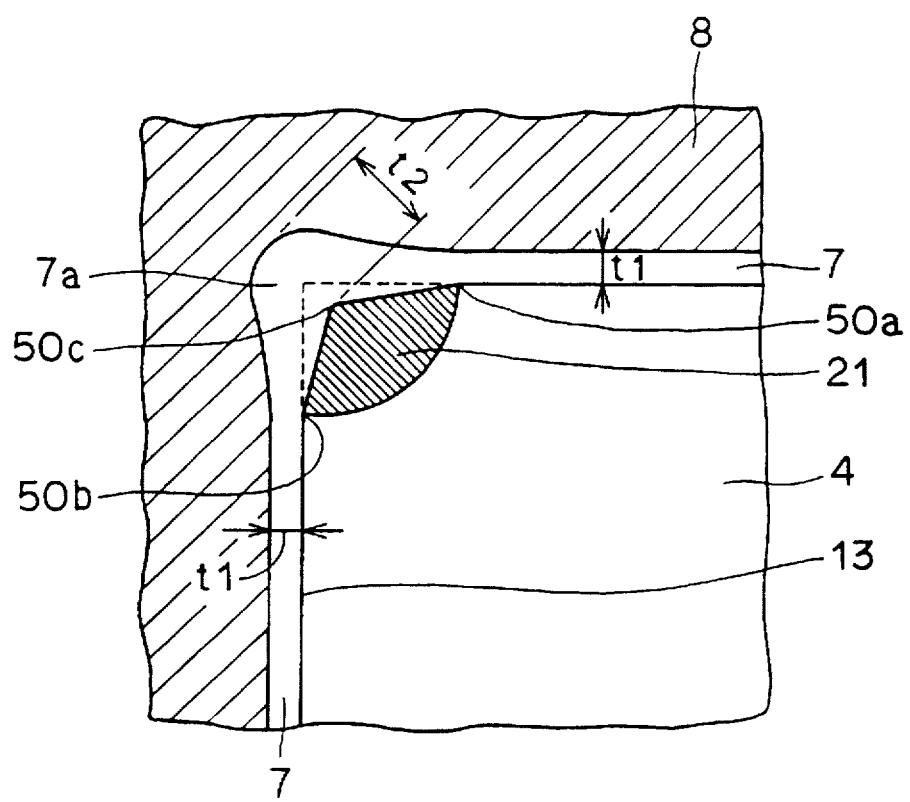
FIG. 5 is a cross sectional view showing region 22 in FIG. 2 being enlarged.

Referring to FIG. 5, the characteristic portion of this embodiment will be now described in detail. FIG. 5 is a cross sectional view showing region 22 in FIG. 2 being enlarged. Referring to FIG. 5, the thickness t2 of corner portion 7a described above is larger than the thickness t1 of silicon oxide film 7 positioned on the sidewall of trench other than at end corner portion 50c. The thickness t2 of corner portion 7a is preferably 1.4 times as large as the thickness of silicon oxide film 7 or larger. More preferably, the thickness t2 of corner portion 7a is twice as large as the thickness t1 of silicon oxide film 7 or larger. Thus, regardless of the surface shape of the silicon substrate in the vicinity of upper end corner portion 50c on the sidewall of trench 13, the breakdown voltage of corner portion 7a of silicon oxide film 7 at upper end corner portion on the sidewall of trench 13 can be effectively improved as compared to the conventional case.

Figure 48:
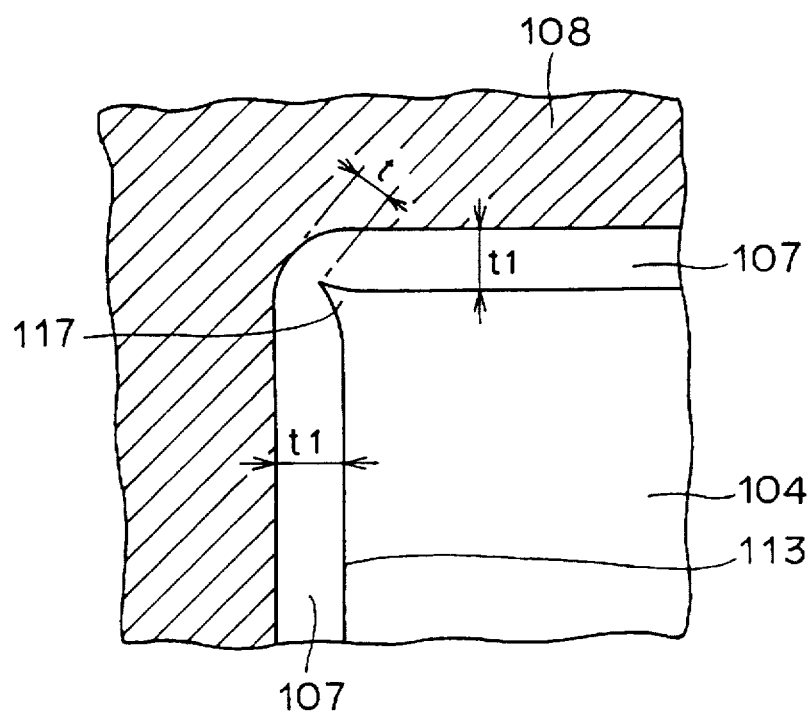
FIG. 48 is a cross sectional view showing region 116 in FIG. 45 being enlarged.
Figure 49:
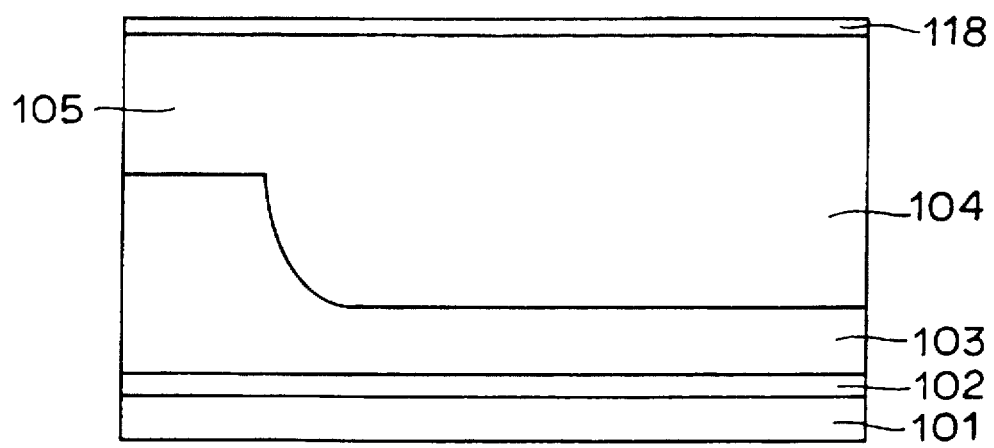
FIG. 49 to 54 are cross sectional views showing first to sixth step in a process of manufacturing a conventional IGBT.
Figure 50:
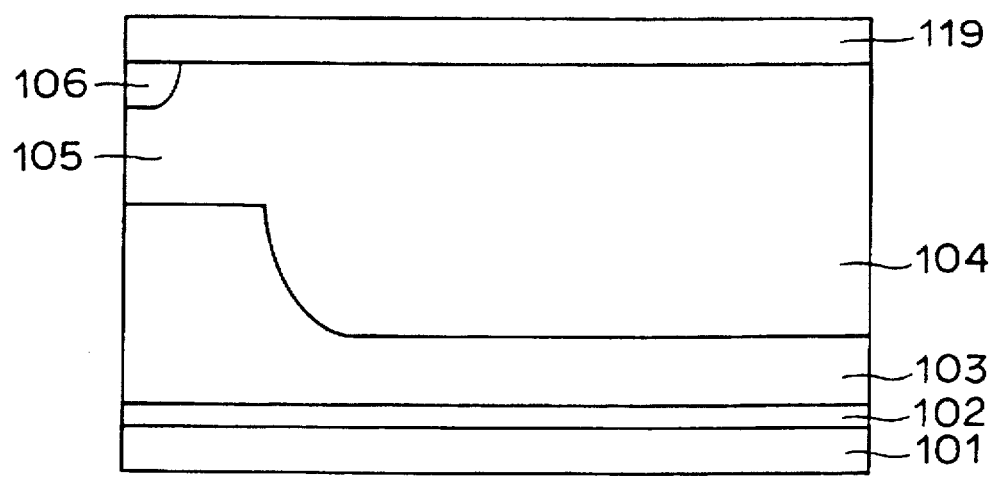
Figure 51:
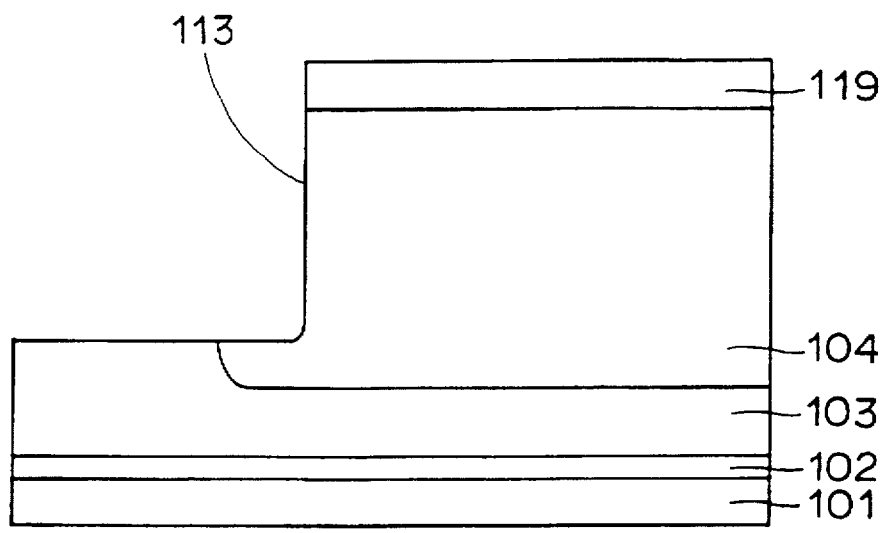
Figure 52:
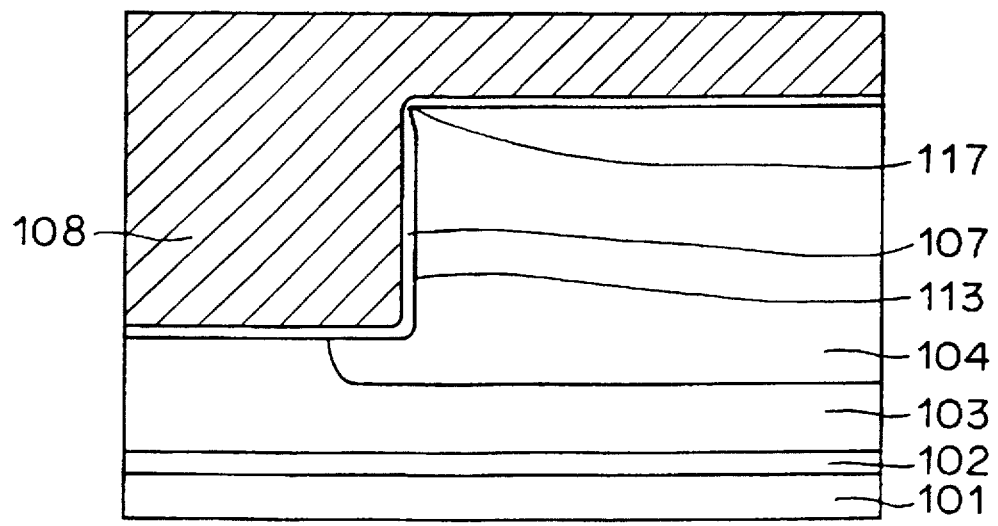
Figure 53:
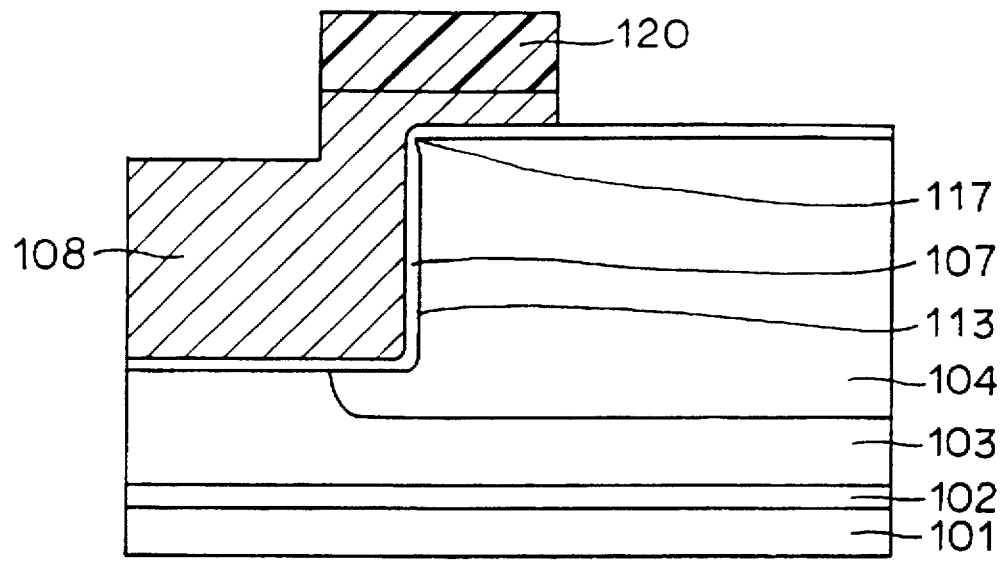
Figure 54:
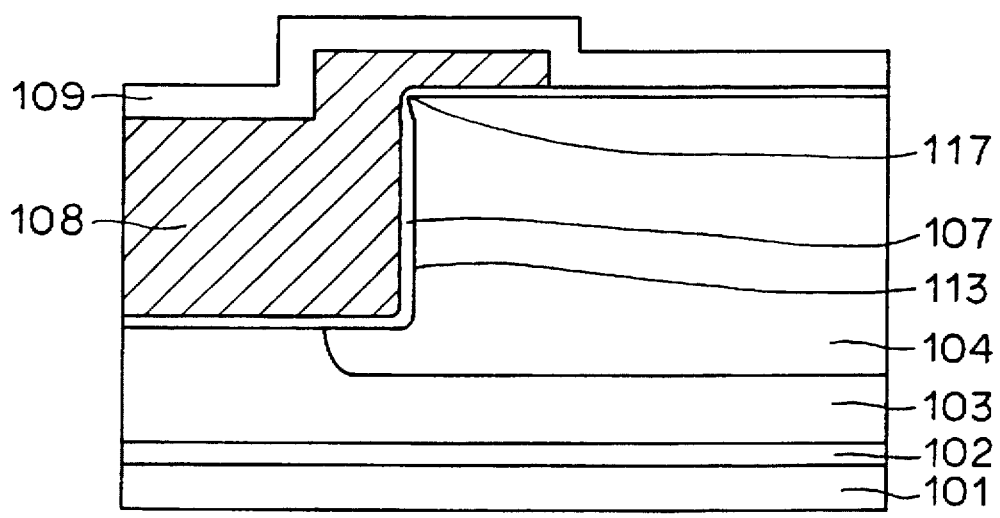
Figure 55:
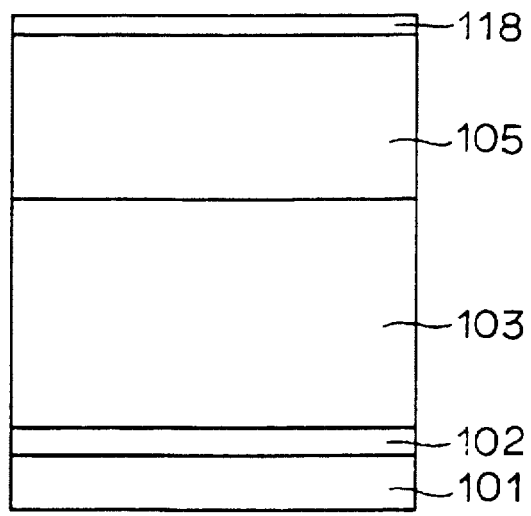
FIGS. 55 to 60 are other cross sectional views showing the first to sixth steps in the process of manufacturing the conventional IGBT.
Figure 56:
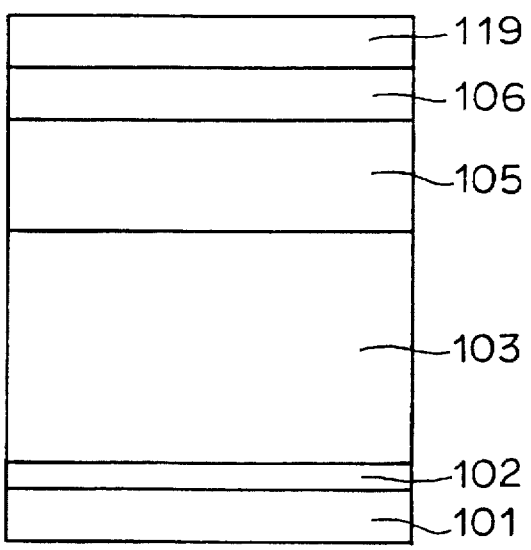
Figure 57:
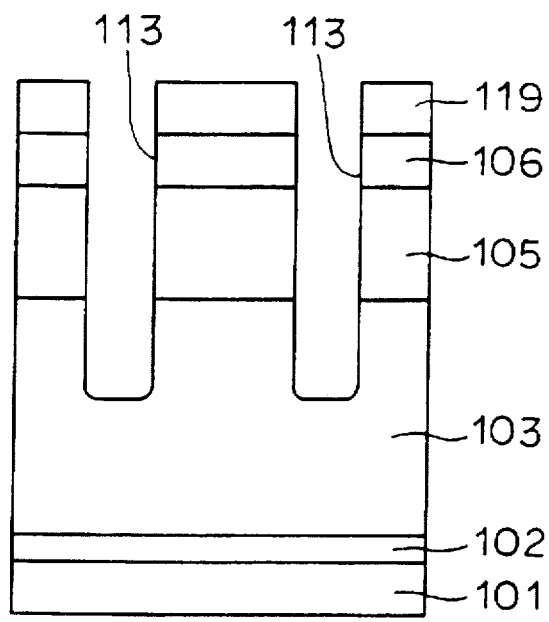
Figure 58:
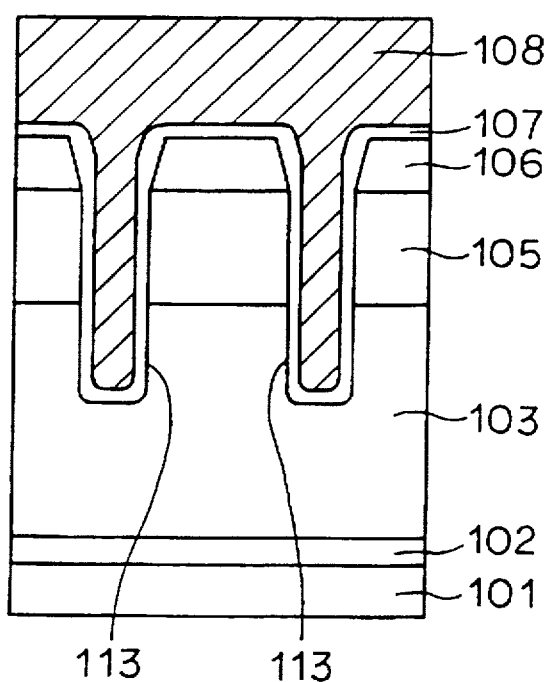
Figure 59:
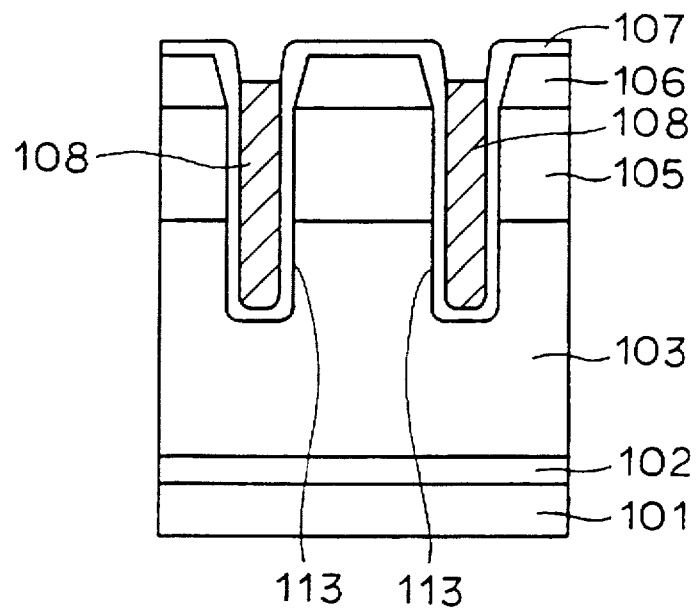
Figure 60:
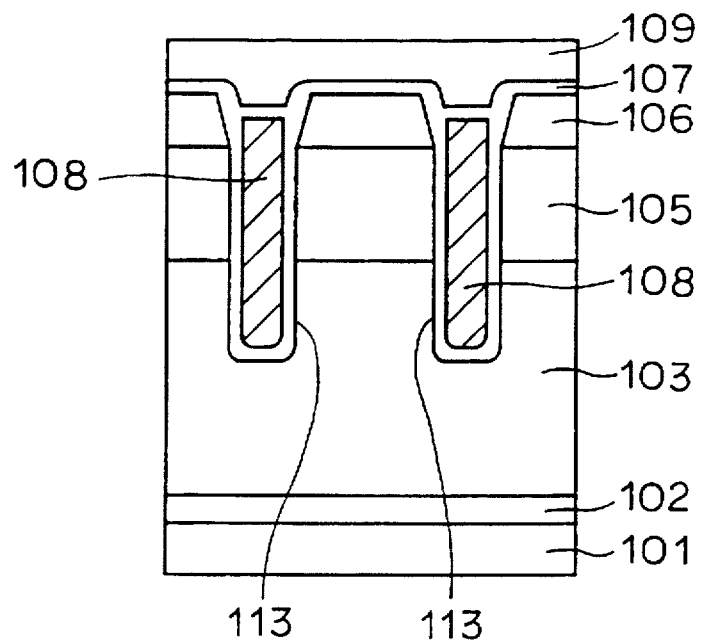
Figure 61:
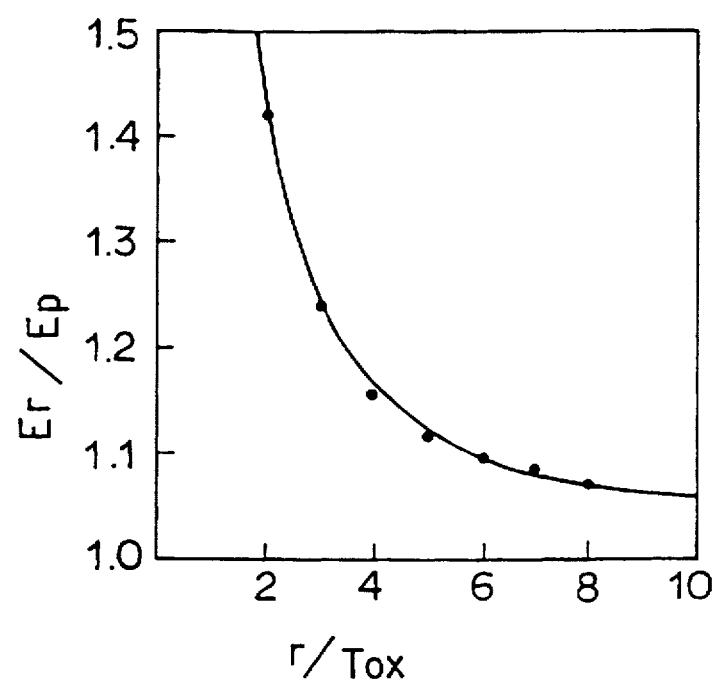
FIG. 61 is a graph showing the relation between the ratio of electric field intensities of the flat portion to the corner portion and radius of curvatures at the corner portion.

More specifically, the breakdown voltage of silicon oxide film 7 can be improved to about a level 1.6 times that of the conventional case shown in FIG. 48. In addition, the upper end corner portion of the sidewall of the trench does not have to be rounded, and therefore the present embodiment is encountered with less difficulty in reducing the size of the device than the second approach described above.

As illustrated in FIG. 5, the thickness of silicon oxide film 7 gradually increases toward upper end corner portion 50c of the sidewall of trench 13, and the thickness t2 of corner portion 7a is largest. As silicon oxide film 7 has such a shape, the breakdown voltage of silicon oxide film 7 positioned on the upper end corner portion 50c of the sidewall of trench 13 and on a region in its vicinity can effectively be improved.

Furthermore, an n type diffusion region 21 is provided to surround upper end corner portion 50c of the sidewall of trench 13 and the region in its vicinity. n type diffusion region 21 has a first end region 50a in the surface of the substrate, and a second end region 50b in the surface of the sidewall of trench 13. Silicon oxide film 7 gradually increases in thickness from the portions positioned on first and second end regions 50a and 50b described above toward corner portion 7c. This is due to the impurity concentration of the surface of n type diffusion region 21.

Since n type diffusion region 21 is formed by a diffusion processing, the concentration gradually decreases toward its circumference. Therefore, the thickness of silicon oxide film 7 formed on the surface of n type diffusion region 21 gradually decreases toward the first and second end regions 50a and 50b of n type diffusion region 21.

Referring to FIGS. 6 to 12, a method of manufacturing the IGBT having the trench structure according to the first embodiment of the invention will be now described. FIGS. 6 to 12 are cross sectional views showing first to seventh steps in the process of manufacturing the IGBT having the trench structure according to the first embodiment of the invention.

Figure 6:
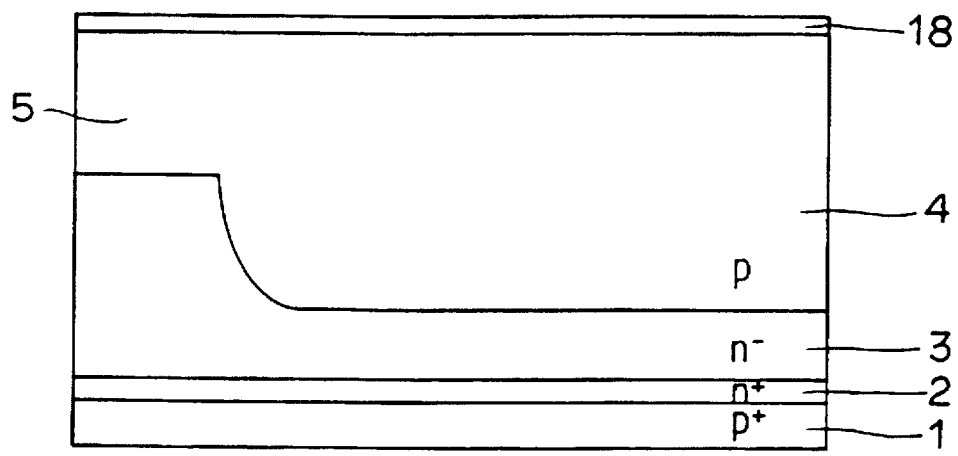
FIGS. 6 to 12 are cross sectional views showing first to seventh steps in a process of manufacturing the IGBT according to the first embodiment of the invention.

Referring to FIG. 6, according to the same method as the conventional case, an n+ type monocrystalline silicon epitaxial layer 2, and an n− type monocrystalline silicon epitaxial layer 3 are sequentially formed on a main surface of p+ type monocrystalline silicon substrate 1. A silicon substrate is thus formed. Then, according to the same method as the conventional case, a silicon oxide film 18, a p type diffusion layer 4 and a p type base diffusion layer 5 are formed.

Figure 7:
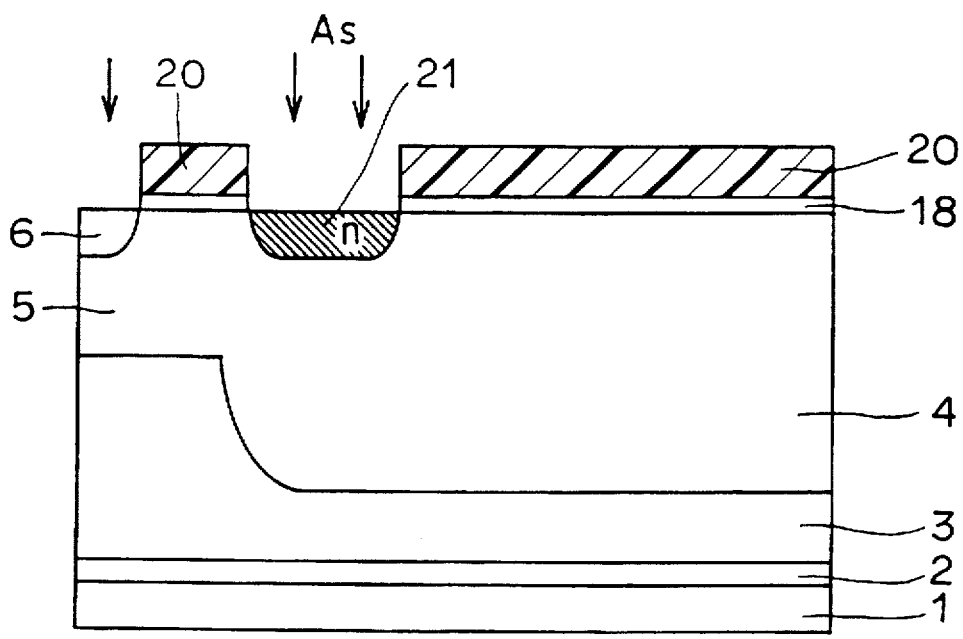

Referring to FIG. 7, resist 20 patterned into a prescribed shape is formed on silicon oxide film 18. Resist 20 is provided with openings for exposing a formation region for n type emitter diffusion layer 6 and a formation region for n type diffusion region 21 in the main surface of the silicon substrate. Using resist 20 as mask, silicon oxide film 18 is patterned into a prescribed shape. Once again using resist 20 as mask, an n type impurity such as arsenic (As) is implanted into a prescribed regions in the surfaces of p type diffusion layer 4 and p type base diffusion layer 5. The implantation is conducted with 50 KeV and $5 \times 10^{15} \text{cm}^{-2}$.

Then, by impurity diffusion techniques, n type emitter diffusion layer 6 and n type diffusion region 21 are formed at a time. At the time, since n type emitter diffusion layer 6 and n type diffusion region 21 can be formed simultaneously simply by changing the shape of patterned resist 20, and therefore the manufacturing cost is hardly increased in forming n type diffusion region 21.

Figure 8:
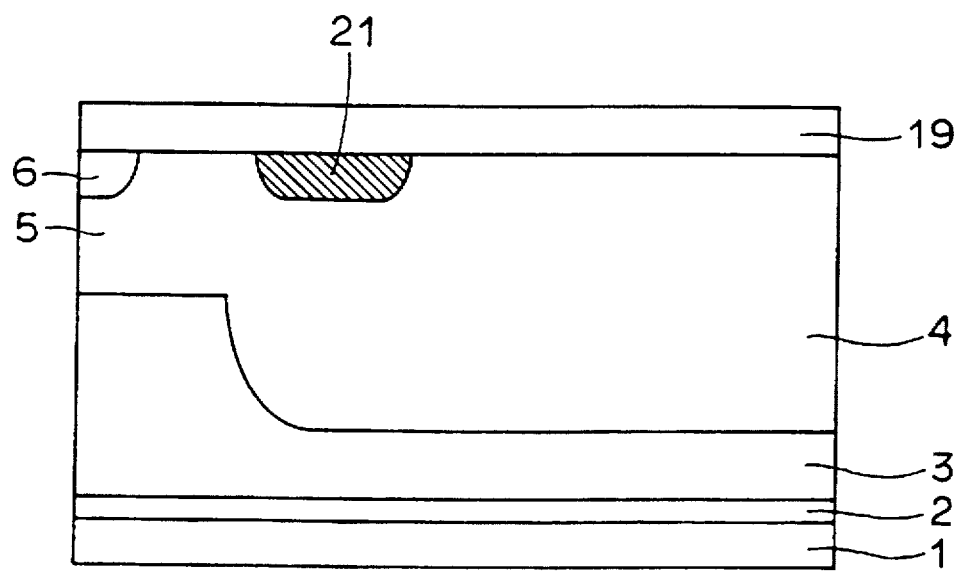

Referring to FIG. 8, after removal of patterned resist 20, a silicon oxide film 19 is formed on the entire main surface of the silicon substrate by means of CVD or the like.

Figure 9:
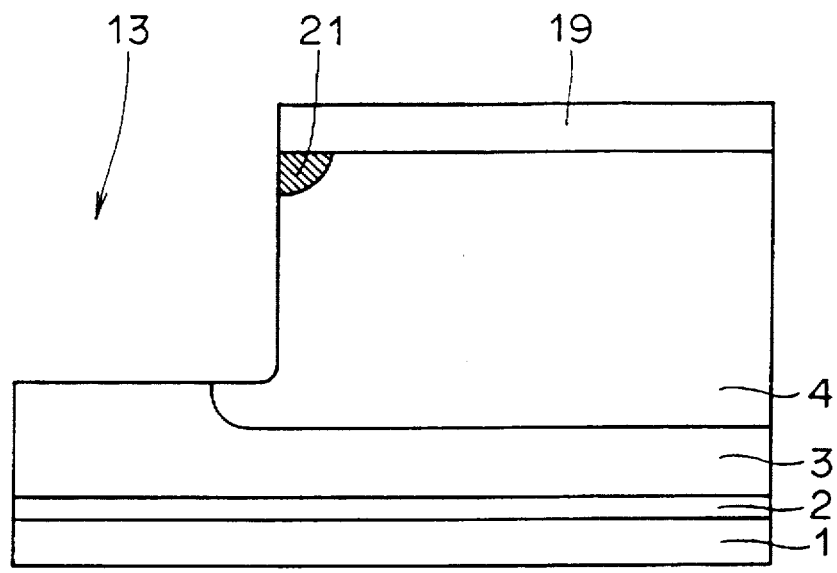

Referring to FIG. 9, silicon oxide film 19 is patterned into a prescribed shape. Using silicon oxide film 19 as mask, the main surface of the silicon substrate is anisotropically etched. A trench 13 is thus formed. At the time, an end of silicon oxide film 19 used as a mask layer is patterned so as to partially cover n type diffusion region 21. Thus, n type diffusion region 21 partially remains on an upper end corner portion of the sidewall of trench 13.

Figure 10:
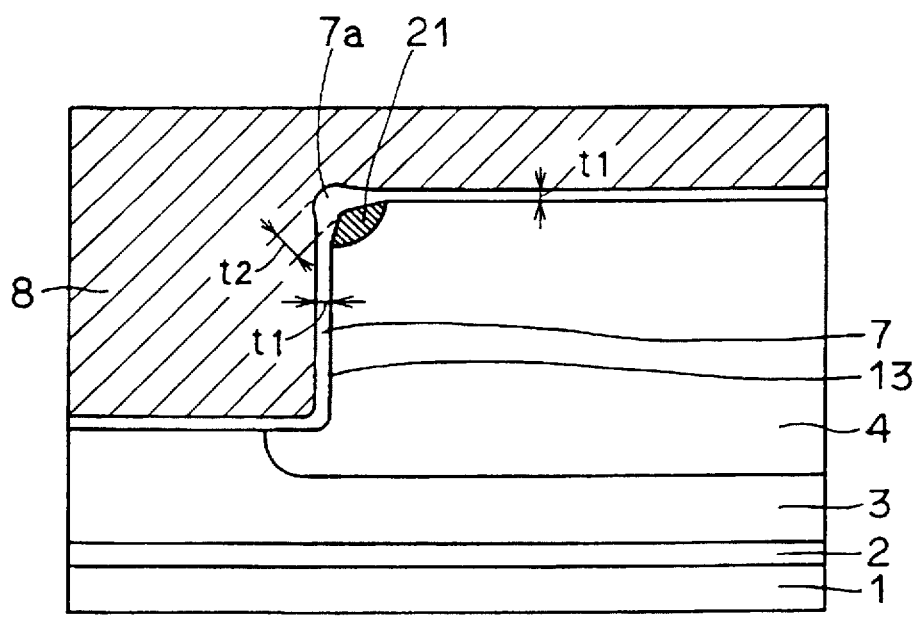

Referring to FIG. 10, according to the same method as the conventional case, oxidation is conducted in order to remove damages given at the time of silicon etching for forming trench 13 described above. Then, an oxide film formed by the oxidation is removed away, and then silicon oxide film 19 is removed. Thereafter, the entire main surface of the silicon substrate is subjected to a thermal oxidation treatment and a silicon oxide film 7 is formed as a result. The oxide film is preferably formed in a mixture atmosphere of oxygen and hydrogen at 950° C. for about 40 minutes. Silicon oxide film 7 as thick as about 1000Å is thus formed.

At the time, n type diffusion region 21 has been formed on the upper end corner portion of the sidewall of trench 13 as described above. Therefore, the thickness t2 of silicon oxide film 7 is increased by the effect of proliferous oxidation in the surface of n type diffusion region 21. More specifically, as illustrated in FIG. 5, silicon oxide film 7 has its thickness locally increased by the effect of proliferous oxidation, and in addition the thickness gradually increases from the portion positioned on the first and second end regions 50a and 50b of n type diffusion region 21 toward the portion positioned on the upper end corner portion 50c of the sidewall of trench 13.

Meanwhile, in the surface of the sidewall of trench 13 without n type diffusion region 21, such proliferous oxidation as described above does not take place. Therefore, the thickness t1 of silicon oxide film 7 formed on that portion is relatively smaller than the thickness of silicon oxide film 7 formed on the surface of n type diffusion region 21 as illustrated in FIG. 5.

The thickness t1 of silicon oxide film 7 formed on the sidewall of trench 13 without n type diffusion region 21 is large enough to function as a gate insulating layer for the MOS transistor formed on the sidewall of trench 13. In contrast, the thickness of silicon oxide film 7 positioned on n type diffusion region 21 is thickness t2 sufficient for securing a high breakdown voltage between n type polycrystalline silicon layer 8 positioned on the region and the silicon substrate.

Accordingly, silicon oxide film 7 thus formed can have a thickness large enough to effectively function as a gate insulating layer on the sidewall of trench 13 without n type diffusion region 21 by the above thermal oxidation process, while the thickness of the film on the upper end corner portion 50c of the sidewall of trench 13 is large enough to effectively improve the breakdown voltage between n type polycrystalline silicon layer 8 functioning as a gate electrode and the silicon substrate.

Note that the surface of n type diffusion region 21 is as illustrated in FIG. 5 inclined toward the side of the silicon substrate at a prescribed angle with respect to the surface of the silicon substrate by the effect of proliferous oxidation at the time of the above thermal oxidation process.

In addition, in the case of silicon oxide film 7 formed according to the above conditions, the thickness t2 of corner portion 7a of silicon oxide film 7 becomes about twice as large as the thickness t1 of silicon oxide film 7 positioned on the sidewall of trench 13. Thus, the breakdown voltage of silicon oxide film 7 at that portion can be improved.

Furthermore, the oxidation treatment is conducted at a relatively low temperature of about 950° C., and therefore changes in the structure of the impurity diffusion layer by high temperature treatment (at about 1100° C.) which was a disadvantage in the conventional case are restrained at a small level.

Figure 11:
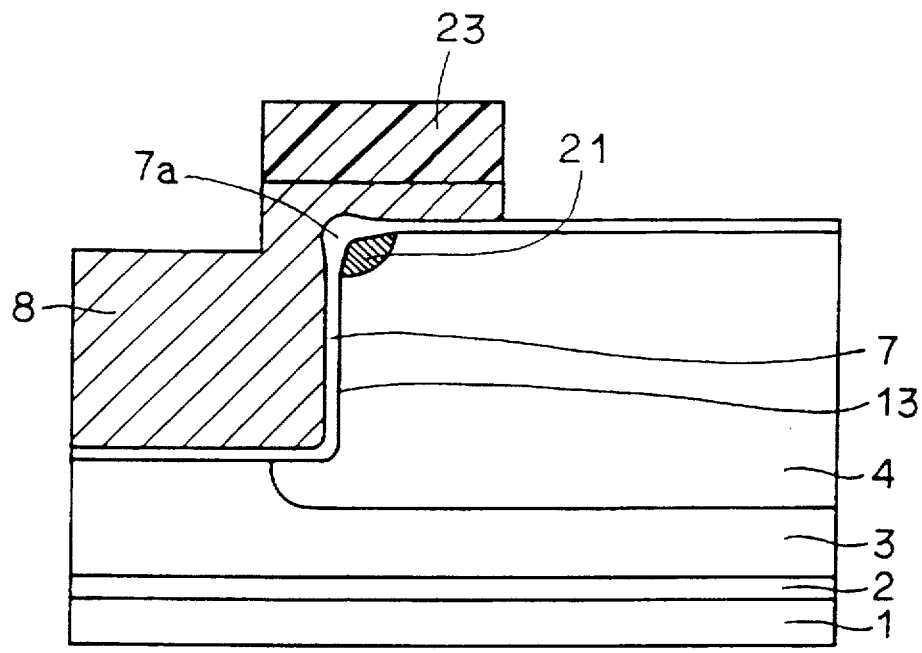

The n type polycrystalline silicon layer 8 is formed on the entire main surface of the silicon substrate by means of CVD. Referring to FIG. 11, resist 23 patterned into a prescribed shape is formed on n type polycrystalline silicon layer 8. Using patterned resist 23 as mask, n type polycrystalline silicon layer 8 is patterned according to the same method as the conventional case. Then, patterned resist 23 is removed.

Figure 12:
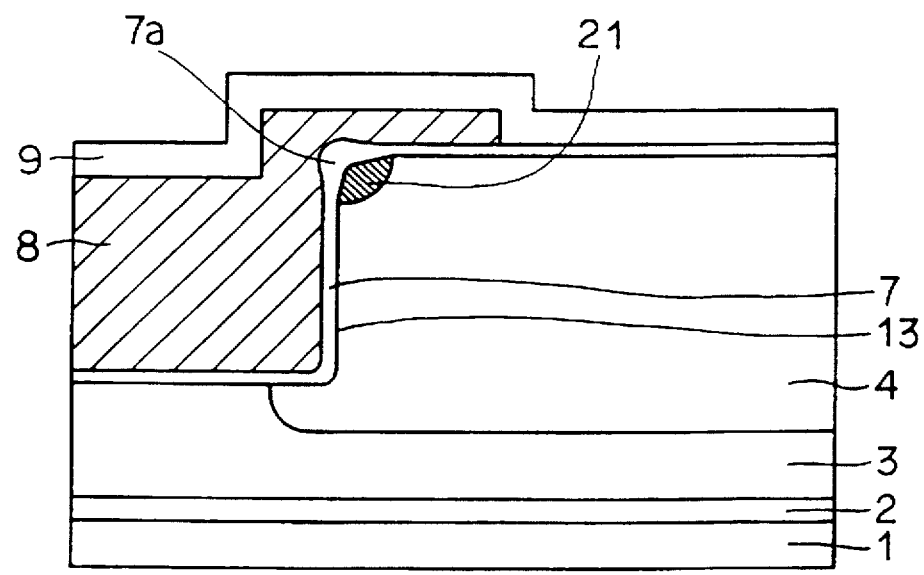

Then, referring to FIG. 12, an interlayer insulating layer 9 formed of a silicon oxide film or the like is formed on the entire main surface of the silicon substrate by means of chemical vapor deposition. Thereafter, according to the same method as the conventional case, interlayer insulating layer 9 described above is patterned into a prescribed shape. Then, barrier metal layer 10, emitter electrode 11, gate electrode 11a and a collector electrode 12 are formed in prescribed regions on interlayer insulating layer 9. Through these steps, the IGBT shown in FIGS. 1 to 4 will be formed.

Although in the above first embodiment, arsenic (As) is used as an n type impurity for forming n type diffusion region 21, the same effect is obtained using phosphorus (P). The amount of such n type impurity implanted at the time of ion implantation may be at least $1 \times 10^{13} cm^{-2}$. The implantation energy can be set arbitrarily.

The temperature at the time of forming silicon oxide film 7 may be within the range from 800° C. to 1000° C. Thus, changes in the structure of other impurity diffusion layers can be restrained to a small level when forming silicon oxide film 7 as described above. Furthermore, silicon oxide film 7 may have a thickness other than 1000Å as long as it can function as a gate insulating layer. An atmosphere, a pressure, time or the like for forming silicon oxide film 7 are appropriately determined accordingly.

Figure 13:
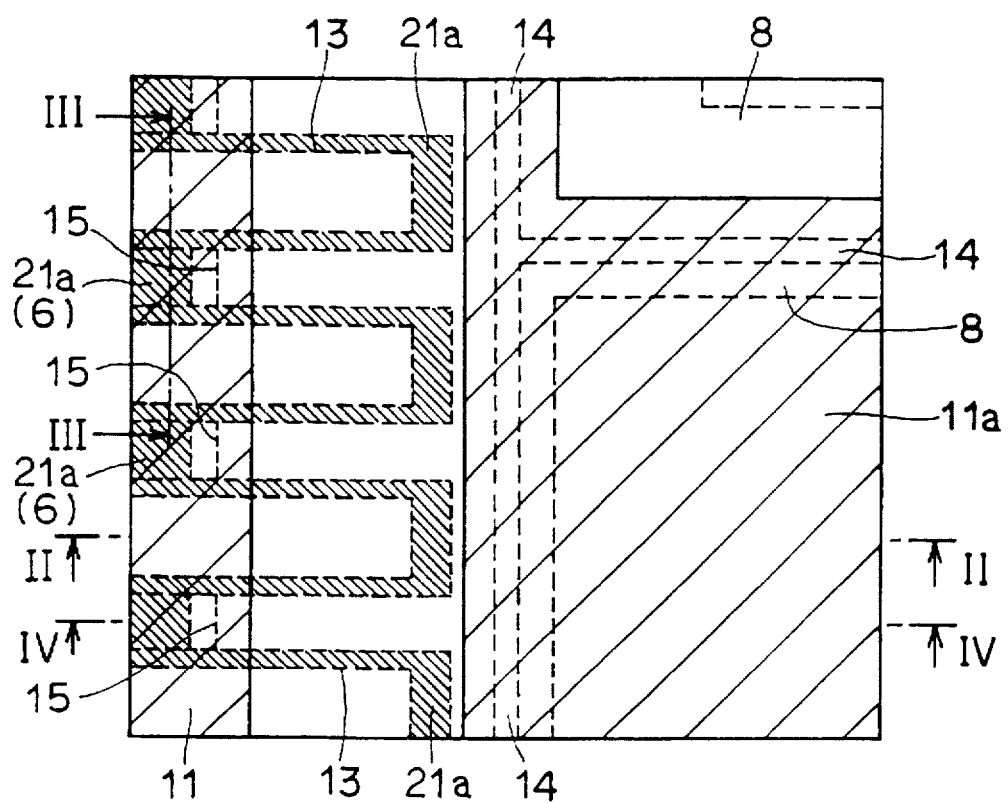
FIG. 13 is a plan view showing an IGBT according to a second embodiment of the invention.
Figure 14:
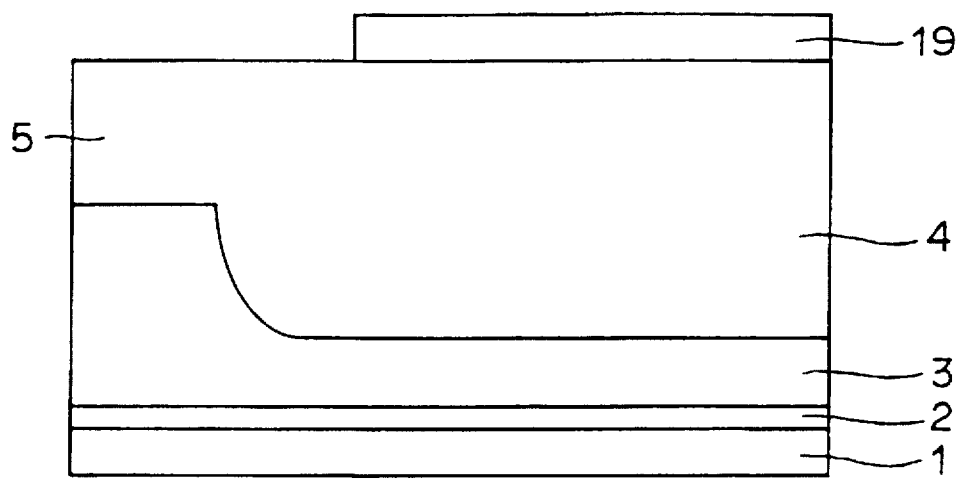
FIGS. 14 and 15 are cross sectional views showing first and second steps in a process of manufacturing the IGBT according to the second embodiment of the invention.
Figure 15:
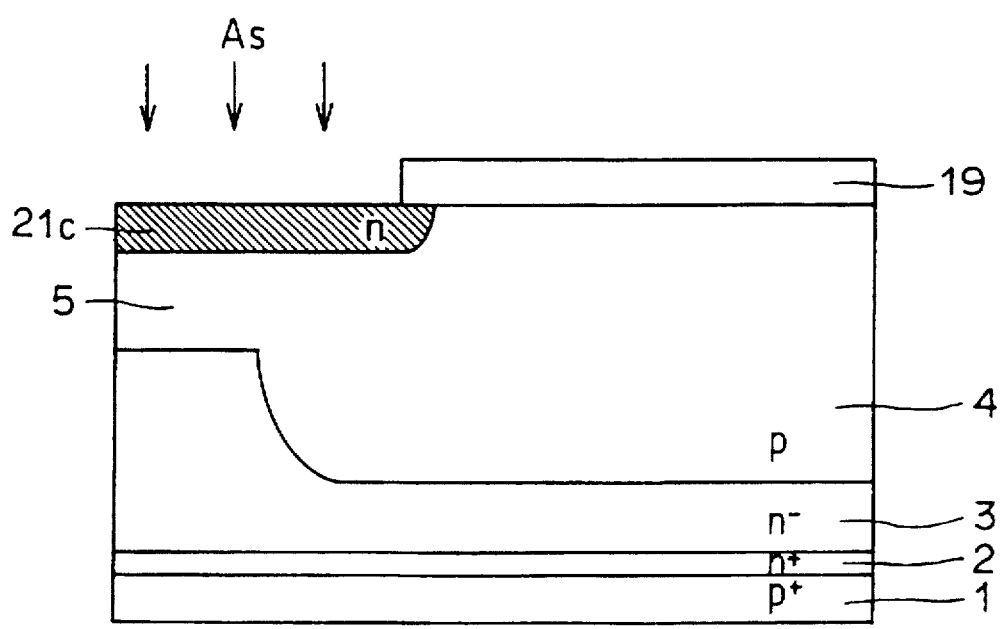

Second Embodiment Referring to FIGS. 13 to 15, a second embodiment of the invention will be now described. The invention is a variation of the pattern of n type diffusion region 21 according to the first embodiment. FIG. 13 is a plan view showing an IGBT according to the second embodiment of the invention. FIGS. 14 and 15 are cross sectional views showing first and second steps which are the most characteristic in a process of manufacturing the IGBT according to this embodiment shown in FIG. 13.

Referring to FIG. 13, the structure according to this embodiment is substantially identical to the structure of the first embodiment with an essential different being that an n type diffusion region 21a is formed to surround a trench 13 and linked with an n type emitter diffusion layer 6. The other structures are the same as those according to the first embodiment. Thus forming n type diffusion region 21a to surround trench 13 forms the corner portion 7a of a silicon oxide film 7 on the entire upper end corner portion of the sidewall of trench 13. This brings about the same effect as the first embodiment. A cross section taken along line II—II in FIG. 13 is the same as FIG. 2. A cross section taken along line III—III is also the same as FIG. 3.

Referring to FIGS. 14 and 15, an example of a method of manufacturing the IGBT according to this embodiment shown in FIG. 13 will be now described. Referring to FIG. 14 through the same steps as the first embodiment, a p type base diffusion layer 5 and a p type diffusion layer 4 are formed. Thereafter, a silicon oxide film 19 is formed on the entire main surface of the silicon substrate by means of chemical vapor deposition. Then, silicon oxide film 19 is patterned into a prescribed shape, and the main surface of the silicon substrate is exposed in a formation region for trench 13 and a formation region for n type emitter diffusion layer 6.

Referring to FIG. 15, using silicon oxide film 19 as mask, an n type impurity such as arsenic (As) or the like is implanted into the main surface of the silicon substrate. The implantation is conducted with 50 KeV, $5 \times 10^{15} cm^{-2}$. Then, the n type impurity is subjected to a diffusion treatment. Thus, simultaneously with the formation of n type emitter diffusion layer 6, an n type diffusion region 21c is formed linked with n type emitter diffusion layer 6 and extending under silicon oxide film 19. At the time, the diffusion treatment may be the one usually conducted for forming n type emitter diffusion layer 6. Therefore, changes in the structure of other impurity diffusion layers due to the diffusion treatment can be restrained to a small level.

Then, as is the case with the first embodiment, using silicon oxide film 19 as mask, the main surface of the silicon substrate is anisotroically etched. Trench 13 is thus formed. As a result, as is the case with the first embodiment, n type diffusion region 21c will partially remain on the upper end corner portion of the sidewall of trench 13. In this case, n type diffusion region 21c remains to surround the entire corner portion on the sidewall of trench 13.

Thereafter, through the same steps as the first embodiment, the IGBT according to the second embodiment shown in FIG. 13 is formed. Note that phosphorus (P) may be used as the n type impurity for forming n type diffusion region 21c. The amount of the n type impurity implanted may be at least $1 \times 10^{13} cm^{-2}$.

Third Embodiment

A third embodiment of the invention will be now described in conjunction with FIGS. 16 to 19. Note that this embodiment is a variation of the pattern of n type diffusion region 21 according to the first embodiment as is the case with the above second embodiment.

Figure 16:
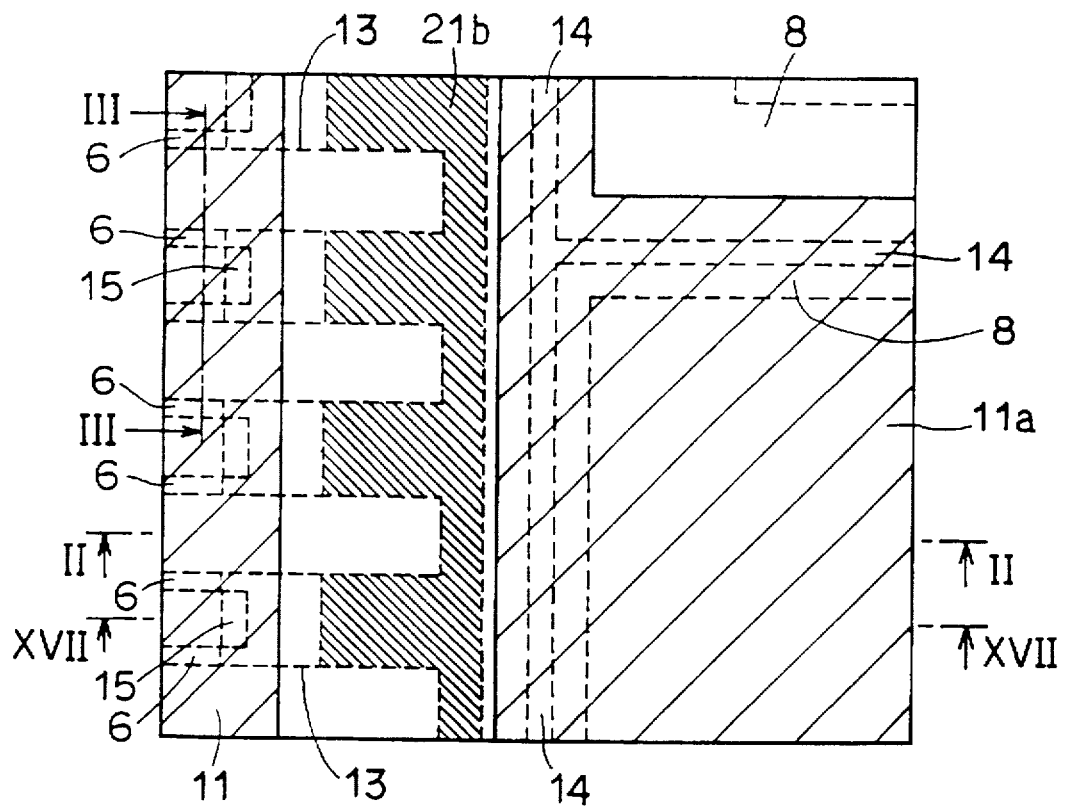
FIG. 16 is a plan view showing an IGBT according to a third embodiment of the invention.

FIG. 16 is a plan view showing an IGBT according to the third embodiment of the invention. Referring to FIG. 16, the third embodiment has a different pattern shape for n type diffusion region 21b from the first embodiment. More specifically, n type diffusion regions 21b are connected with each other to be integral. Thus forming n type diffusion region 21b makes it easier to form a mask layer used at the time of implanting an n type impurity into the main surface of the silicon substrate for forming n type diffusion region 21b. More specifically, a photolithography step for forming patterned resist to be used as a mask layer is more easily conducted than each embodiment described above.

The other structures are the same as the first embodiment. Thus, the same effect as the first embodiment is obtained.

Figure 17:
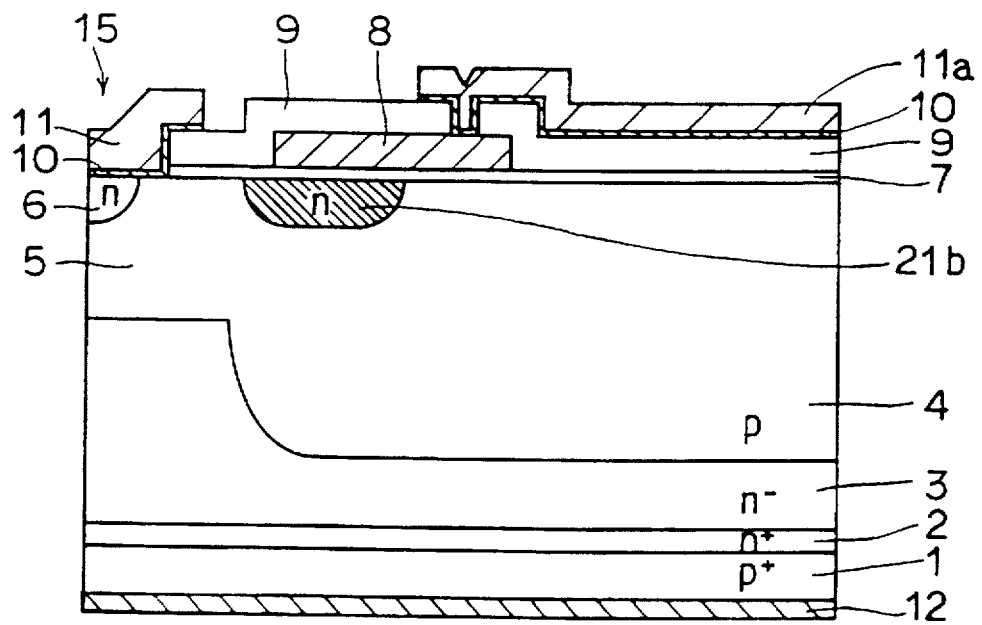
FIG. 17 is a cross sectional view taken along line XVII—XVII in FIG. 16.

Note that FIG. 17 shows a cross section taken along line XVII—XVII in FIG. 16. A cross section taken along line II—II in FIG. 16 is the same as FIG. 2. A cross section taken along line III—III in FIG. 16 is the same as FIG. 13.

In the first and second embodiments described above, n type diffusion regions 21, 21a and n type emitter diffusion layer 6 are formed by a single step. n type emitter diffusion layer 6 and n type diffusion regions 21, 21a may be formed in separate steps. In such a case, n type diffusion region 21b and n type emitter diffusion layer 6 can be formed under different conditions. Note that n type diffusion region 21b and n type emitter diffusion layer 6 may be formed in separate steps under the same conditions as each embodiment described above.

As described above, forming n type emitter diffusion layer 6 and n type diffusion region 21b in separate steps makes it possible to form a p type diffusion region in place of n type diffusion region 21b.

Figure 18:
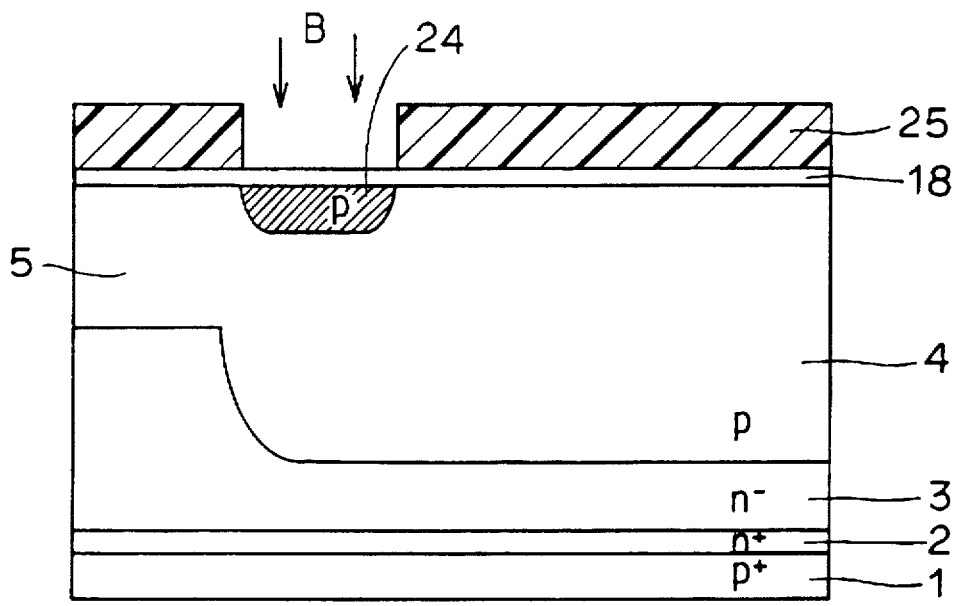
FIGS. 18 and 19 are cross sectional views showing first and second steps in one example of a process of manufacturing the IGBT according to the third embodiment of the invention.
Figure 19:
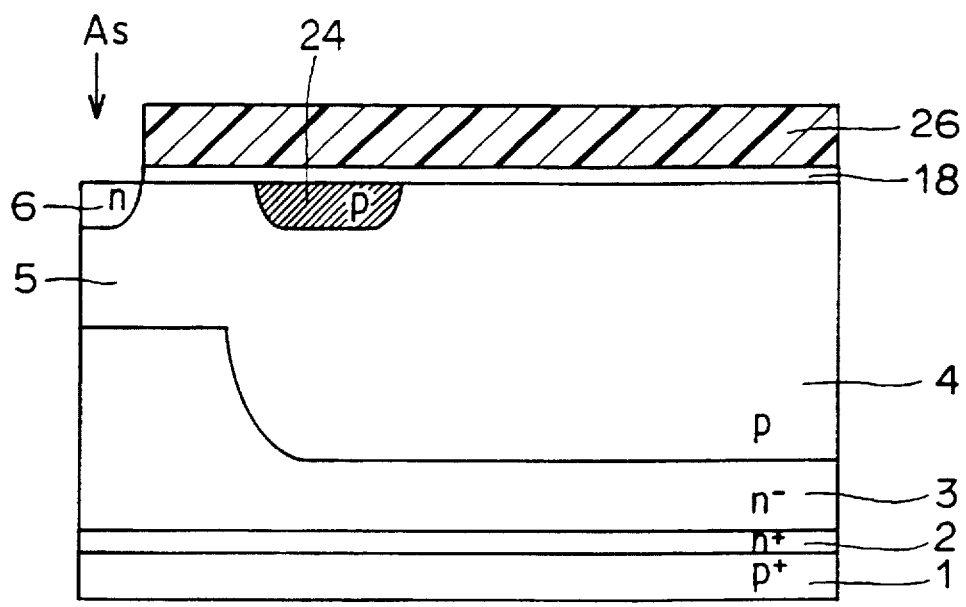

Referring to FIGS. 18 and 19, a method of manufacturing the IGBT according to this embodiment will be described by way of illustrating the case of forming a p type diffusion region 24. FIGS. 18 and 19 are cross sectional views showing first and second steps the most characteristic in the manufacturing method in the case of forming p type diffusion region 24 according to this embodiment.

Referring to FIG. 18, through the same steps as the first and second embodiments, p type diffusion layer 4 and p type base diffusion layer 5 are formed. Then, resist 25 patterned into a prescribed shape is formed on a silicon oxide film 18. Then, using patterned resist 25 as mask, a p type impurity such as boron (B) and $BF_2$ is implanted into the main surface of the silicon substrate. The implantation may be conducted with 50 KeV and $8 \times 10^{15} cm^{-2}$. Note that the amount of the p type impurity may be at least $1 \times 10^{14} cm^{-2}$. p type diffusion region 24 is thus formed.

Referring to FIG. 19, patterned resist 26 to expose a formation region for an n type emitter diffusion layer 6 is formed on the main surface of the silicon substrate. Using pattern resist 26 as mask, silicon oxide film 18 is patterned. Thereafter, once again using patterned resist 26 as mask, an n type impurity such as arsenic (As) is implanted under the same conditions as the first embodiment. n type emitter diffusion layer 6 is thus formed. Thereafter through the same steps as the first embodiment, the IGBT according to this embodiment is formed.

As described above, the following effect is brought about by forming p type diffusion region 24 in place of n type diffusion region 21b. More specifically, the IGBT would be free from parasitic operations if n type diffusion regions 21, 21a according to the first and second embodiments are formed. Some devices however may be encountered with the problem of parasitic operations if such n type diffusion regions 21, 21a are formed. In that case, such parasitic operations can effectively be prevented by forming p type diffusion region 24 according to this embodiment.

Fourth Embodiment

Figure 20:
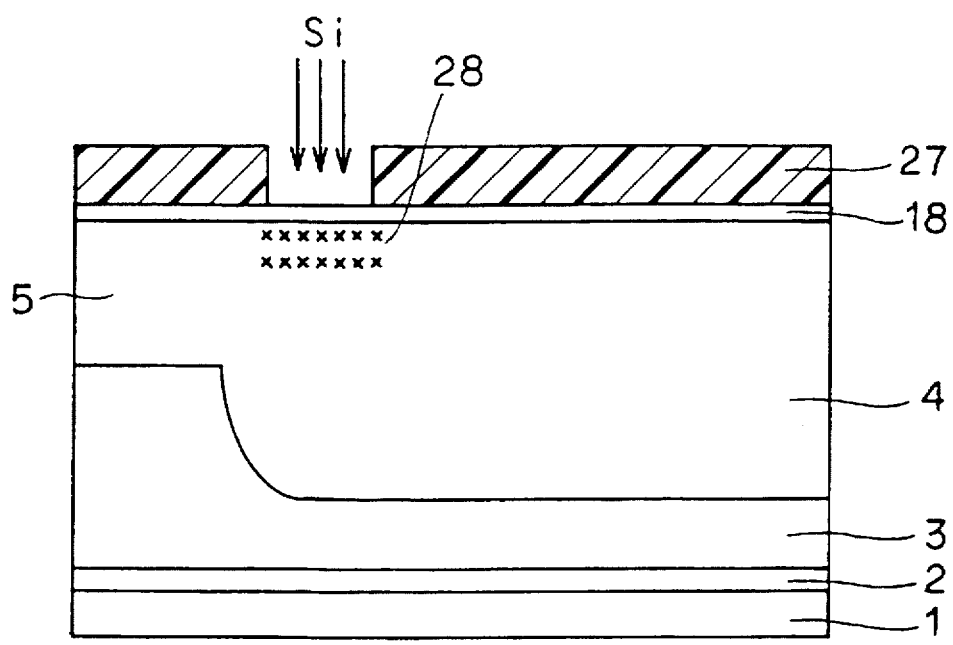
FIGS. 20 and 21 are cross sectional views showing first and second steps in a process of manufacturing an IGBT according to a fourth embodiment of the invention.
Figure 21:
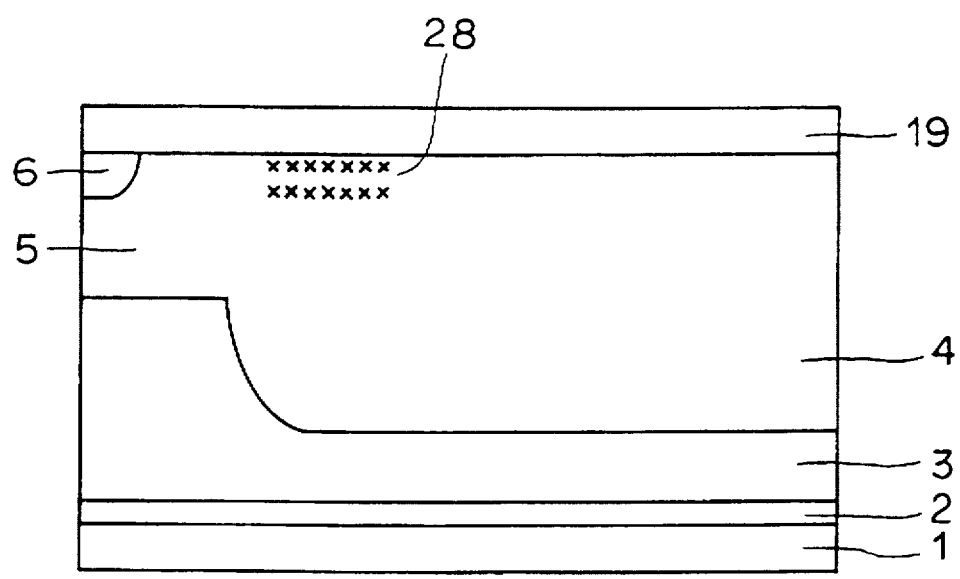

Referring to FIGS. 20 and 21, a fourth embodiment of the invention will be described. This embodiment is a variation of the method of manufacturing the IGBT according to the first embodiment. FIGS. 20 and 21 are cross sections showing first and second steps characteristic in the method of manufacturing the IGBT according to the fourth embodiment of the invention.

Referring to FIG. 20, through the same steps as the first embodiment, a p type diffusion layer 4 and a p type base diffusion layer 5 are formed. Then, patterned resist 27 to expose a region for forming an end region of a trench 13 is formed on a silicon oxide film 18. Using patterned resist 27 as mask, silicon (Si) ions are implanted into the main surface of p+ type monocrystalline silicon substrate 1. Silicon implanted region 28 is thus formed. The silicon implantation is preferably conducted with about 70 KeV, $3 \times 10^{15} cm^{-2}$. Then, patterned resist 27 is removed.

Then, referring to FIG. 21, through the same steps as the first embodiment, n type emitter diffusion layer 6 and silicon oxide film 19 are sequentially formed. Thereafter, the IGBT is formed through the same steps as the first embodiment.

In this embodiment, the crystallinity of the region of the main surface of the silicon substrate in silicon implanted region 28 is disturbed and the region attains a silicon rich state. Therefore, forming a silicon oxide film 7 in the same manner as the first embodiment makes the thickness of silicon oxide film 7 locally large on the surface of silicon implanted region 28. Therefore, the same effect as the first embodiment is obtained.

Note that in this embodiment, silicon (Si) ions are implanted in order to achieve proliferous oxidation effects. However, a material inert to silicon such as argon (Ar) gas or helium (He) gas may be implanted. The crystallinity of silicon in the implanted region is thus disturbed, and the flatness of a surface is disturbed, resulting in proliferation of oxidation. The same effect as the first embodiment is thus obtained.

The amount of silicon or the inert material such as argon to be implanted must be more than the amount of the n type impurity in order to achieve the same effect. More specifically, for silicon ions, argon ions or helium ions, at least about $1 \times 10^{14} cm^{-2}$ would be necessary as an amount to be implanted.

Fifth Embodiment

Figure 22:
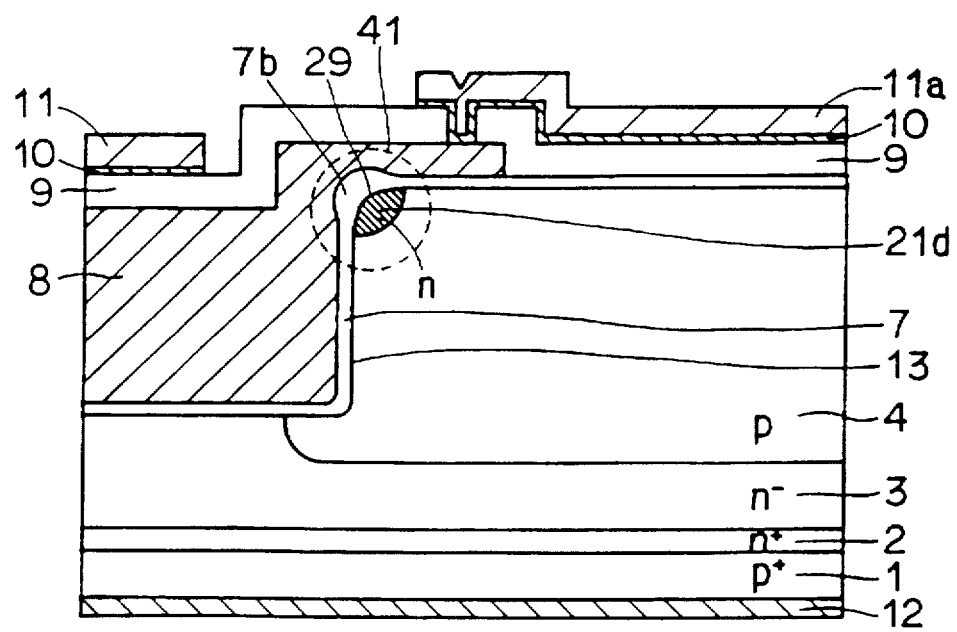
FIG. 22 is a cross sectional view showing an IGBT according to a fifth embodiment of the invention.

Referring to FIGS. 22 to 28, a fifth embodiment of the invention will be now described. FIG. 22 is a cross sectional view showing an TGBT according to the fifth embodiment of the invention. Referring to FIG. 22, the IGBT according to this embodiment is substantially structurally identical to the IGBT according to the first embodiment with an essential difference being that in this embodiment the corner portion on the sidewall of trench 13 is rounded to have a prescribed curvature. The other structures are the same as those of the IGBT according to the second embodiment shown in FIG. 2.

As illustrated in FIG. 22, the corner portion on the sidewall of trench 13 and a surface region 29 in its vicinity are rounded, and therefore the degree of concentration of electric field in the upper end corner portion of the sidewall of trench 13 is reduced compared to the case of the first embodiment. The breakdown voltage of silicon oxide film 7b positioned on the upper end corner portion of the sidewall of trench 13 can be improved more than the case of the first embodiment.

Figure 23:
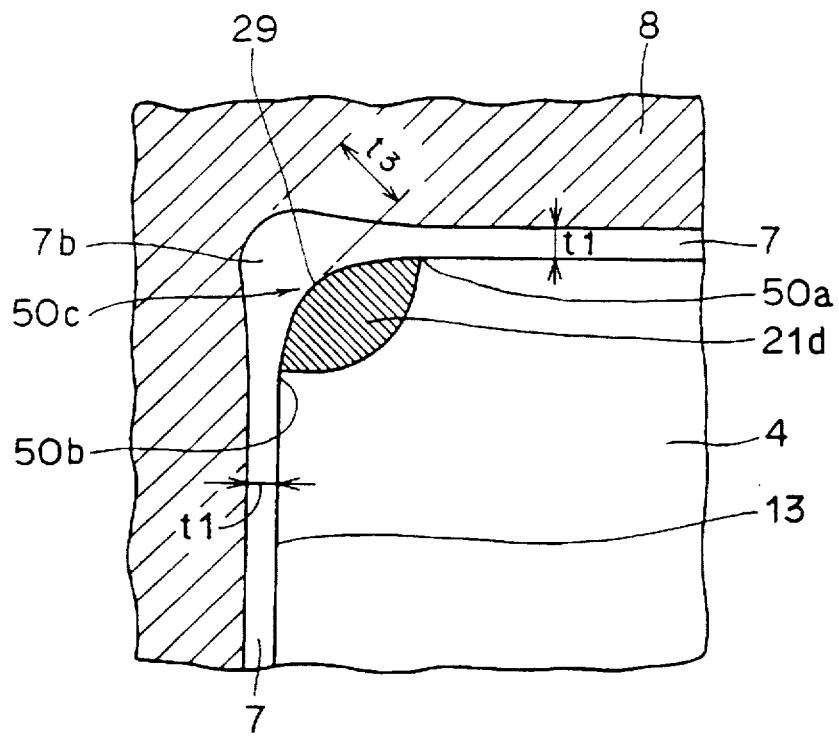
FIG. 23 is a cross sectional view showing region 41 in FIG. 22 being enlarged.

FIG. 23 is a cross sectional view showing region 41 in FIG. 22 being enlarged. Referring to FIG. 23, the structure in region 41 in FIG. 22 will be described in detail. Referring to FIG. 23, as is the case with the first embodiment, the thickness t3 of silicon oxide film 7 at corner portion 7b is larger than the thickness t1 of silicon oxide film 7 positioned on the sidewall of trench 13 in this embodiment.

More specifically, as is the case with the first embodiment, thickness t3 is about twice as large as thickness t1. Thus, breakdown voltage at least the same as the first embodiment can be obtained. In addition, according to this embodiment, upper end corner portion 50c on the sidewall of trench 13 is rounded to have a prescribed curvature. This makes it possible to improve the breakdown voltage of corner portion 7b more than the first embodiment.

As is the case with the first embodiment, silicon oxide film 7 has its thickness gradually increased from the portion positioned on the first and second end regions 50a, 50b of n type diffusion region 21d toward the upper end corner portion 50c of the sidewall of trench 13. The effect brought thereby is the same as the first embodiment.

Note that in this embodiment, upper end corner portion 50c needs only be rounded such that its tip end portion is round, and therefore it is not necessary to round upper end corner portion 50c as much as the case of the second approach described above. Therefore, there will be no problem in reducing the size of the device.

Referring to FIGS. 24 to 28, a method of manufacturing the IGBT according to the fifth embodiment of the invention will be now described. FIGS. 24 to 28 are cross sectional views showing first to fifth steps in a method of manufacturing the IGBT according to this embodiment.

Figure 24:
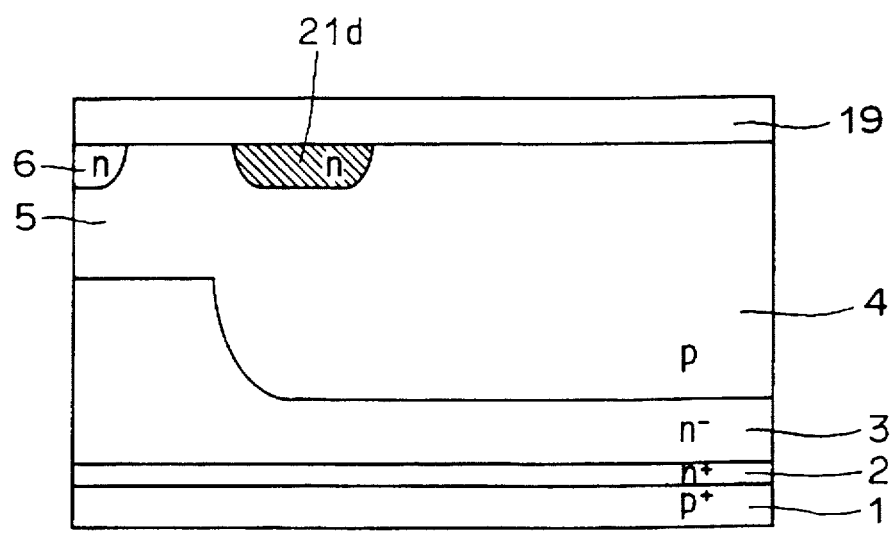
FIGS. 24 to 28 are cross sectional views showing first to fifth steps in a process of manufacturing the IGBT according to the fifth embodiment of the invention.

Referring to FIG. 24, thorough the same steps as the first embodiment, n type emitter diffusion layer 6, n type diffusion region 21d and silicon oxide film 19 are formed.

Figure 25:
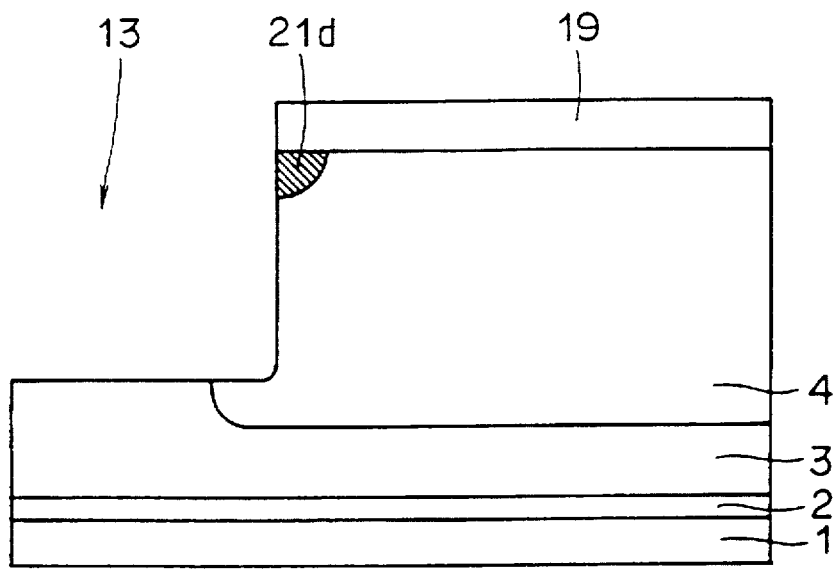

Referring to FIG. 25, by the same method as the first embodiment, a silicon oxide film 19 is patterned into a prescribed shape, and using silicon oxide film 19 as mask, a trench 13 is formed on the main surface of the silicon substrate. Then, silicon oxide film 19 is removed.

Figure 26:
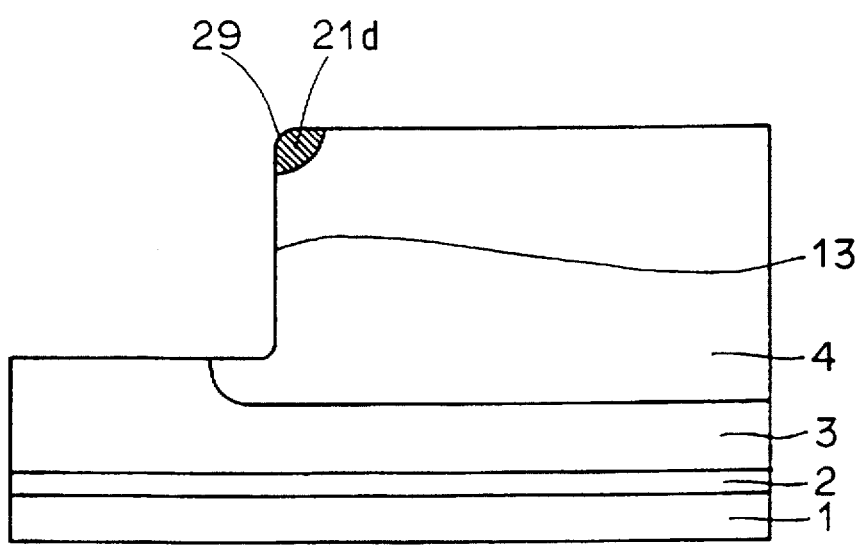

Referring to FIG. 26, using argon (Ar) gas ions or helium (He) gas ions, the entire main surface of the silicon substrate is subjected to an ion beam etching treatment. Thus, the upper end corner portion 50c of the sidewall of trench 13 and surface region 29 in its vicinity are impinged on with argon gas ions and take a round shape with a prescribed curvature.

Figure 27:
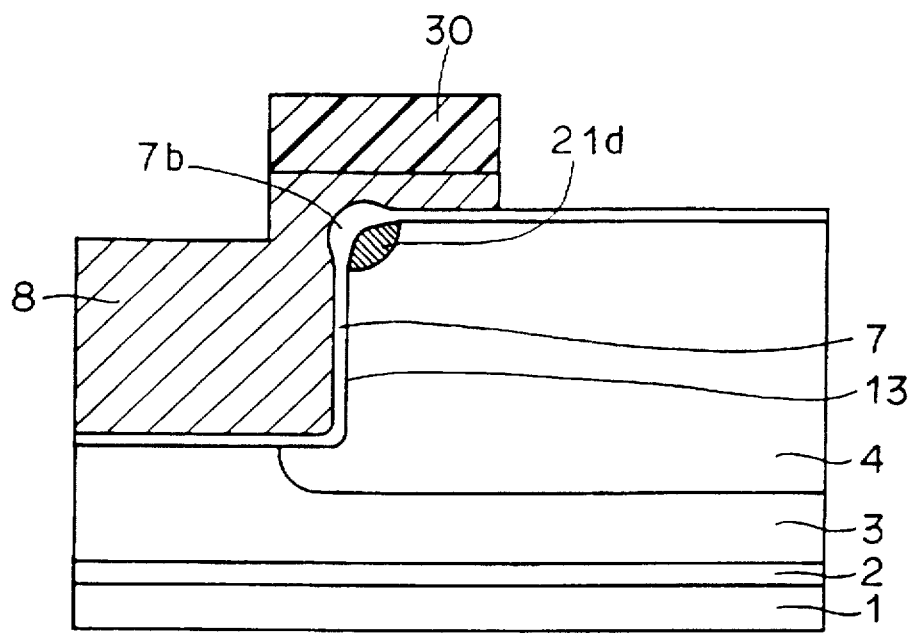

Referring to FIG. 27, by the same method as the first embodiment, oxidation is conducted for removal of damages generated at the time of silicon etching for forming trench 13 and then an oxide film formed at the time of the oxidation is removed away. Then, the entire main surface of the silicon substrate is subjected to a thermal oxidation treatment. The conditions are the same as those of the first embodiment. A silicon oxide film 7 is thus formed. The thickness of corner portion 7b of silicon oxide film 7 at the time is about twice as large as the thickness of silicon oxide film 7 positioned on the sidewall of trench 13.

Thereafter, a polycrystalline silicon layer 8 containing an n type impurity is formed on silicon oxide film 7 by means of chemical vapor deposition. Then, resist 30 patterned into a prescribed shape is formed on polycrystalline silicon layer 8, and using patterned resistor 30 as mask, n type polycrystalline silicon layer 8 is patterned into a prescribed shape.

Figure 28:
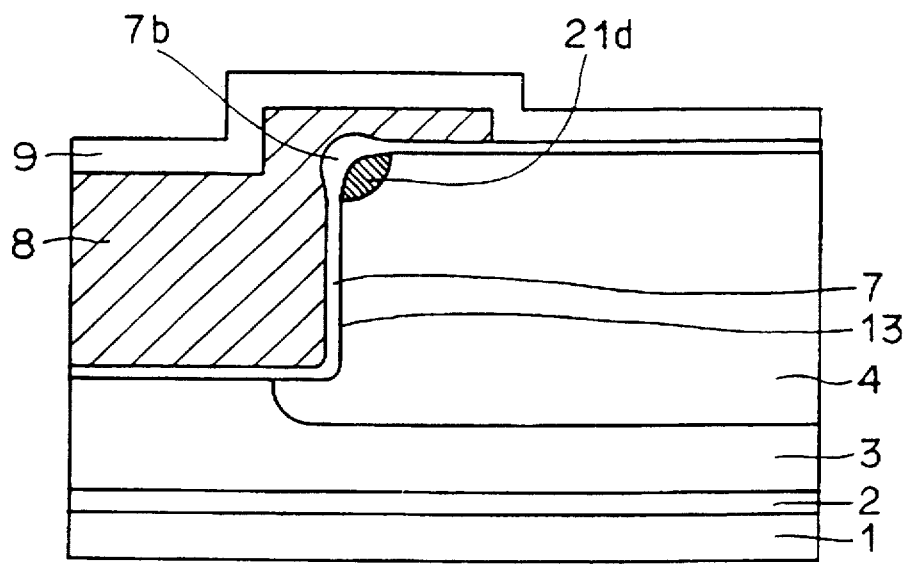

Then, referring to FIG. 28, as is the case with the first embodiment, an interlayer insulating layer 9 is deposited on n type polycrystalline silicon layer 8. Thereafter, through the same steps as the first embodiment, the IGBT as illustrated in FIG. 22 will be formed.

By the method of manufacturing according to the embodiment, the ion beam etching is employed as a method of rounding upper end corner portion 29 of the sidewall of trench 13, but a chemical dry etching process as described in Japanese Patent Laying-Open No. 64-57623 may be used. The corner portion 7b of silicon oxide film 7 may be formed thicker by any method described in conjunction with each embodiment described above.

Sixth Embodiment

Figure 29:
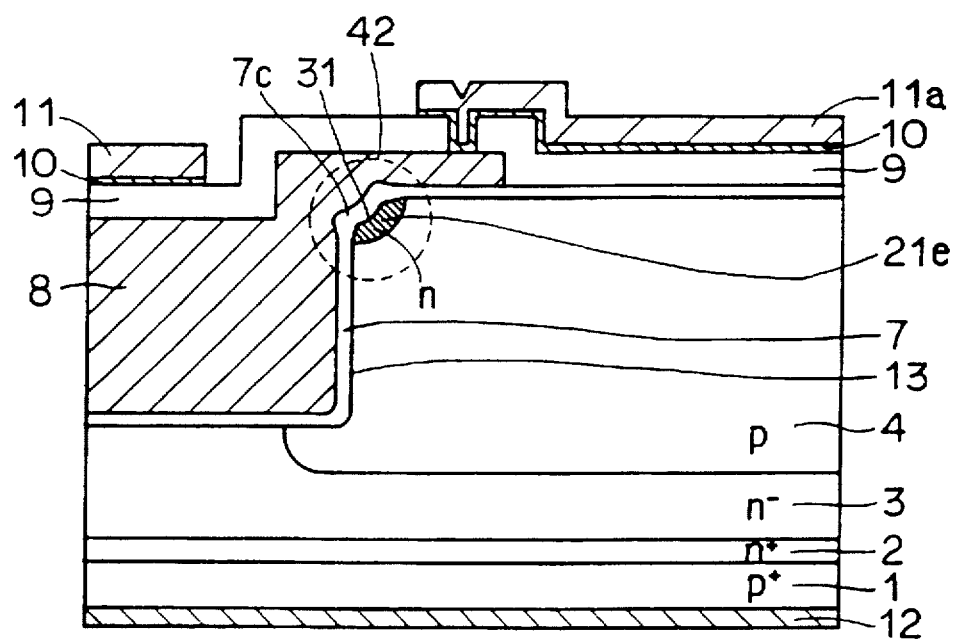
FIG. 29 is a cross sectional view showing an IGBT according to a sixth embodiment of the invention.

Referring to FIGS. 29 to 38, a sixth embodiment of the invention will be now described. FIG. 29 is a cross sectional view showing an IGBT according to the sixth embodiment of the invention.

Referring to FIG. 29, the IGBT according to this embodiment is substantially identical to the IGBT according to the first embodiment illustrated in FIG. 2 with an essential difference being that a recess 31 is formed at the upper end corner portion of the sidewall of trench 13. The other structures are the same as those of the first embodiment illustrated in FIG. 2.

Thus forming recess 31 forms the upper end corner portion on the sidewall of trench 13 into a gently sloped shape as compared to the first embodiment. Thus, the degree of concentration of electric field at the upper end corner portion on the sidewall of trench 13 may be relaxed more than the first embodiment.

Figure 30:
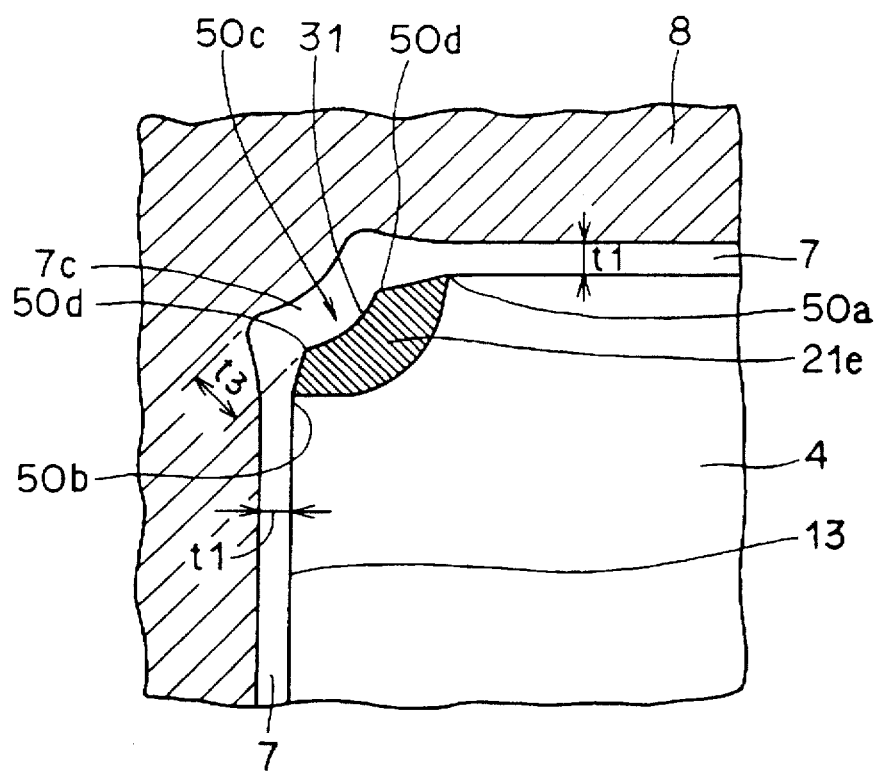
FIG. 30 is a cross sectional view showing region 42 in FIG. 29 being enlarged.

FIG. 30 shows region 42 in FIG. 29 being enlarged. Referring to FIG. 30, the structure of this embodiment will be described in more detail. Referring to FIG. 30, the thickness t3 of silicon oxide film 7 at corner portion 7c is about twice as large as the thickness t1 of the portion of silicon oxide film 7 positioned on the sidewall of trench 13 in this embodiment. Therefore, the breakdown voltage of corner portion 7c of silicon oxide film 7 is secured as is the case with the first embodiment.

In this embodiment, silicon oxide film 7 also has a shape with its thickness gradually increasing from the portion positioned on first and second end regions 50a, 50b of n type diffusion region 21e toward upper end corner portion 50c on the sidewall of trench 13.

Note that as illustrated in FIG. 30, in this embodiment, a raised portion 50d defining recess 31 is formed. The tip end of raised portion 50d is however formed to have an obtuse angle, and therefore the degree of concentration of electric field at the portion can be restrained at at least a level equivalent to the case of the first embodiment.

Referring to FIGS. 31 to 35, a method of manufacturing the IGBT according to the sixth embodiment of the invention will be now described. FIGS. 31 to 35 are cross sectional views showing first to fifth steps in a process of manufacturing the IGBT according to this embodiment.

Figure 31:
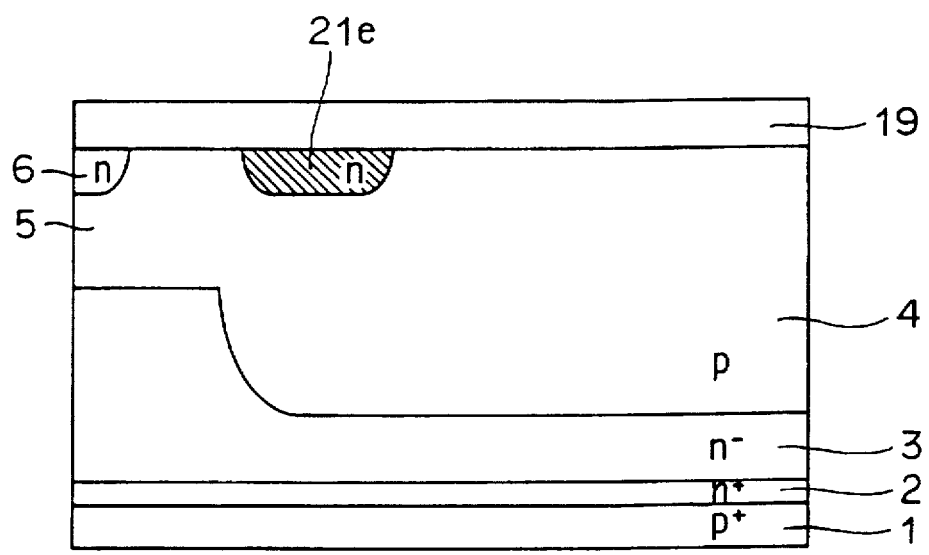
FIGS. 31 to 35 are cross sectional views showing first to fifth steps in a process of manufacturing the IGBT according to the sixth embodiment of the invention.

Referring to FIG. 31, through the same steps as the first embodiment, an n type emitter diffusion layer 6, an n type diffusion region 21e and a silicon oxide film 19 are formed.

Figure 32:
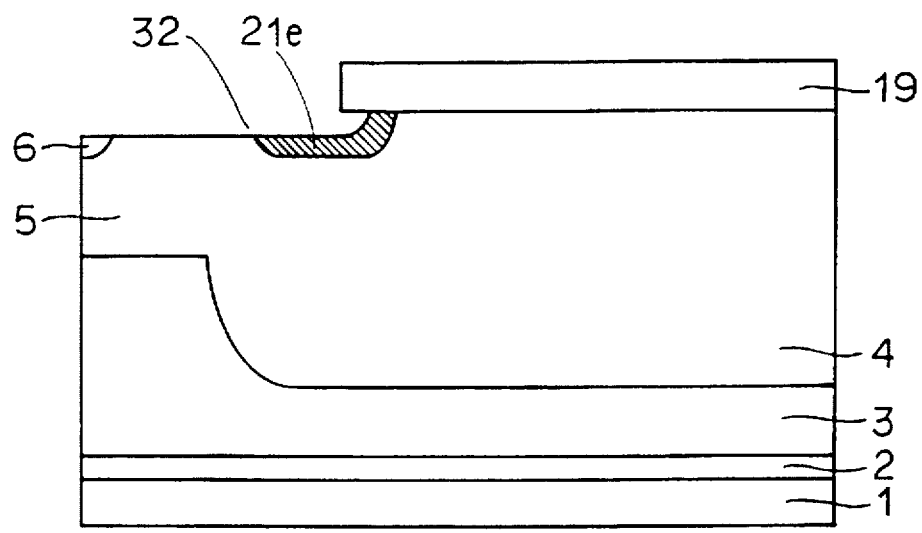

Referring to FIG. 32, silicon oxide film 19 is patterned to expose a formation region for trench 13 in the main surface of the silicon substrate. Using silicon oxide film 19 as mask, a shallow recess 32 is formed by means of isotropic etching. At the time, shallow recess 32 is formed such that a prescribed region of the end of recess 32 is present in n type diffusion region 21e, and a part of the bottom of recess 32 is present in n type diffusion region 21e.

Figure 33:
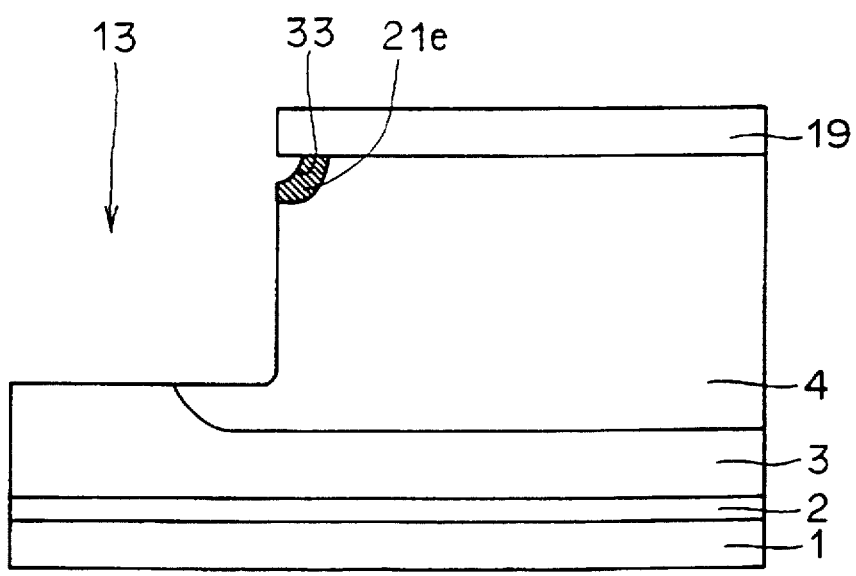

Referring to FIG. 33, using silicon oxide film 19 as mask, the main surface of the silicon substrate is anisotropically etched. Trench 13 is thus formed. Through the two-stage etching step described above, a recess 33 is formed at the upper end corner portion of the sidewall of trench 13. Thereafter, silicon oxide film 19 is removed.

Figure 34:
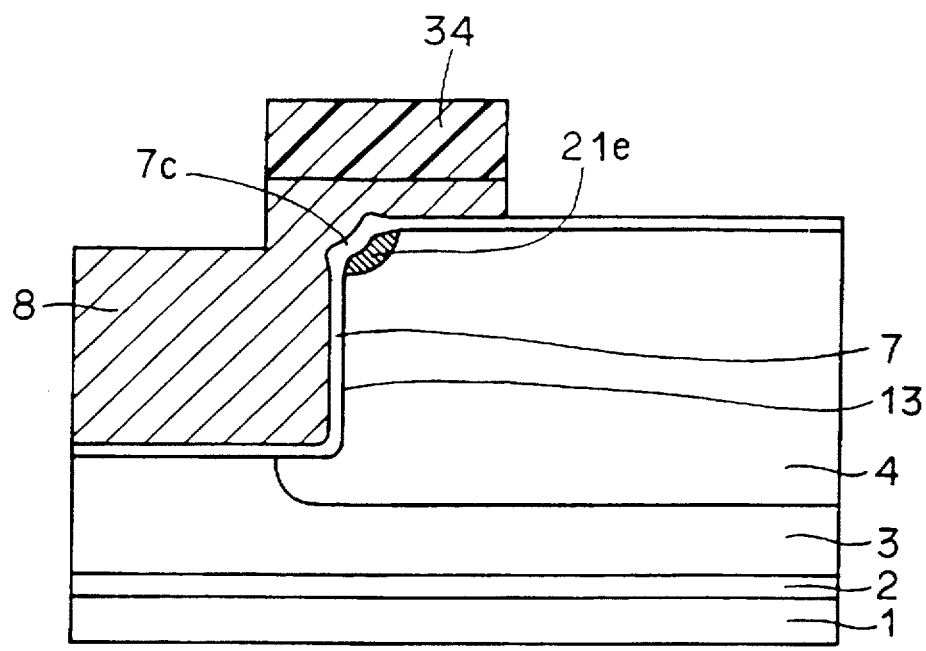

Referring to FIG. 34, by the same method as the first embodiment, oxidation for removing damages generated at the time of silicon etching for forming trench 13 is conducted, and then an oxide film formed accordingly is removed. Then, a silicon oxide film 7 is formed under the same conditions as the first embodiment.

As is the case with the first embodiment, the thickness of corner portion 7c of silicon oxide film 7 is formed larger by the effect of proliferous oxidation. In this case, the thickness of corner portion 7c may be formed into about twice as large as the thickness of silicon oxide film positioned on the sidewall of trench 13. The breakdown voltage of corner portion 7c can be improved as a result.

Then, by the same method as the first embodiment, an n type polycrystalline silicon layer 8 is formed on the entire main surface of the silicon substrate. Resist 34 patterned into a prescribed shape is formed on n type polycrystalline silicon layer 8. Using patterned resist 34 as mask, n type polycrystalline silicon layer 8 is patterned into a prescribed shape.

Figure 35:
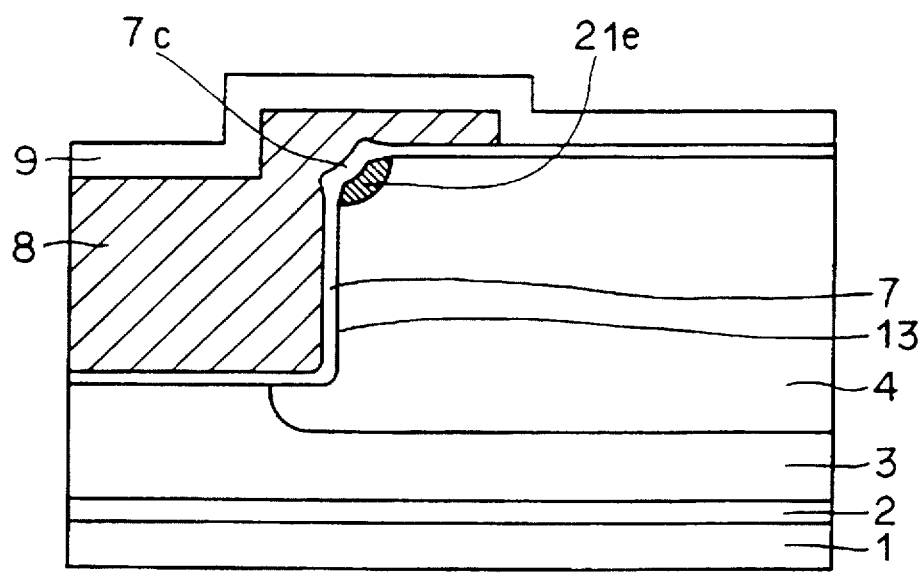

Referring to FIG. 35, an interlayer insulating layer 9 is formed on the entire main surface of the silicon substrate. Thereafter, the IGBT as shown in FIG. 29 is formed through the same steps as the first embodiment.

Note that also in this embodiment, any method described in conjunction with each embodiment described above may be employed as a method of forming the corner portion 7c of silicon oxide film 7.

Figure 36:
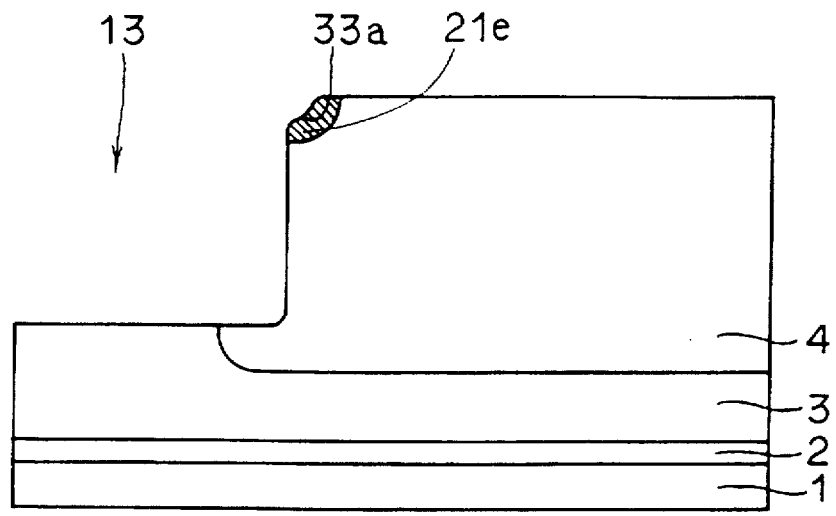
FIGS. 36 and 37 are cross sectional views showing fourth and fifth steps in a process of manufacturing a variation of the IGBT according to the sixth embodiment of the invention.
Figure 37:
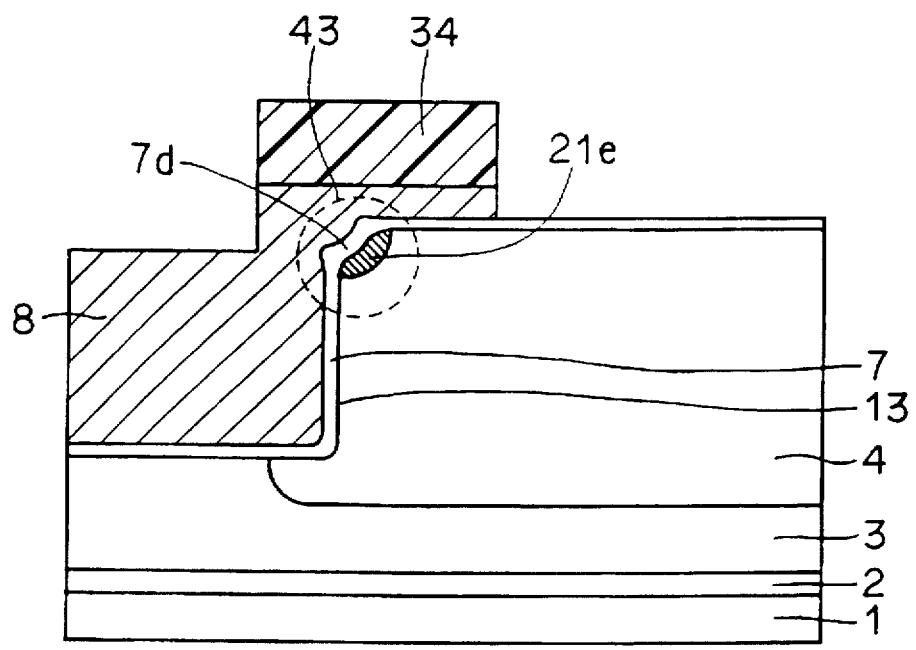
Figure 38:
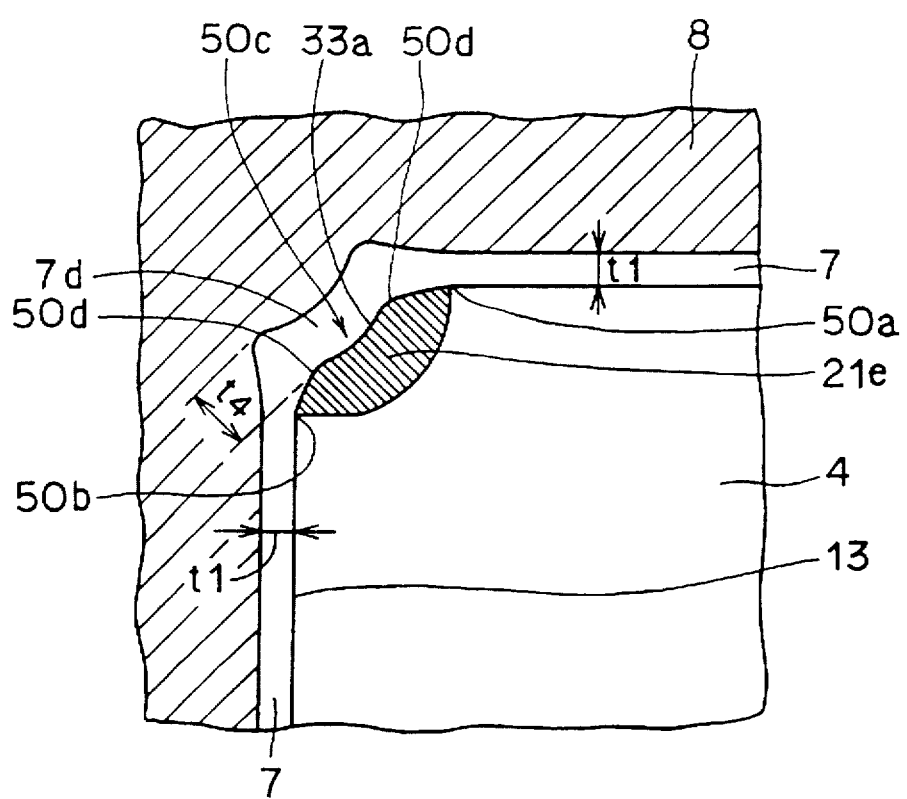
FIG. 38 is a partially enlarged cross sectional view showing an IGBT formed by a variation of the method of manufacturing the IGBT according to the sixth embodiment of the invention.

Referring to FIGS. 36 to 38, a variation of the sixth embodiment will be now described. FIGS. 36 and 37 are cross sectional views showing fourth and fifth steps in a process of manufacturing the IGBT according to the variation. FIG. 38 is a cross sectional view showing region 43 in FIG. 37 being enlarged.

Referring to FIG. 38, the structure of the variation will be now described. Referring to FIG. 38, in the variation, the tip end of raised portion 50d positioned in the periphery of a recess 34 provided at the upper end corner portion 50c of the sidewall of trench 13 has a rounded shape. The other structures are the same as the IGBT according to the sixth embodiment illustrated in FIG. 30.

Thus rounding the tip end of raised portion 50d defining the circumference of recess 34 permits the breakdown voltage of corner portion 7d of silicon oxide film 7 to be improved more than the sixth embodiment. Note that also in this variation, the thickness t4 of corner portion 7d can be about twice as large as the thickness t1 of silicon oxide film 7 positioned on the sidewall of trench 13. Therefore, the effect brought about is the same as each embodiment described above.

Referring to FIGS. 36 and 37, a method of manufacturing the variation will be described. Referring to FIG. 36, through the same steps as the sixth embodiment, trench 13 is formed. Then a silicon oxide film 19 is removed. Using argon gas ions or the like, the entire main surface of the silicon substrate is subjected to an ion beam etching treatment. Thus, the surface of recess 33a at the upper end corner portion of the sidewall of trench 13 is rounded. More specifically, the tip end portion of a raised portion (50d) defining a recess 33a will be rounded.

Referring to FIG. 37, by the same method as the first embodiment, a silicon oxide film 7, and an n type polycrystalline silicon layer 8 are formed. Then, the IGBT according to the variation is formed through the same steps as the first embodiment.

Note that in the variation, any method in each embodiment described above may be employed for forming the corner portion 7d of silicon oxide film 7.

Seventh Embodiment

A method of manufacturing an IGBT according to a seventh embodiment of the invention will be now described in conjunction with FIGS. 39 to 43. FIGS. 39 to 42 are cross sectional views showing first to fourth steps in a process of manufacturing the IGBT according to the seventh embodiment of the invention.

Figure 39:
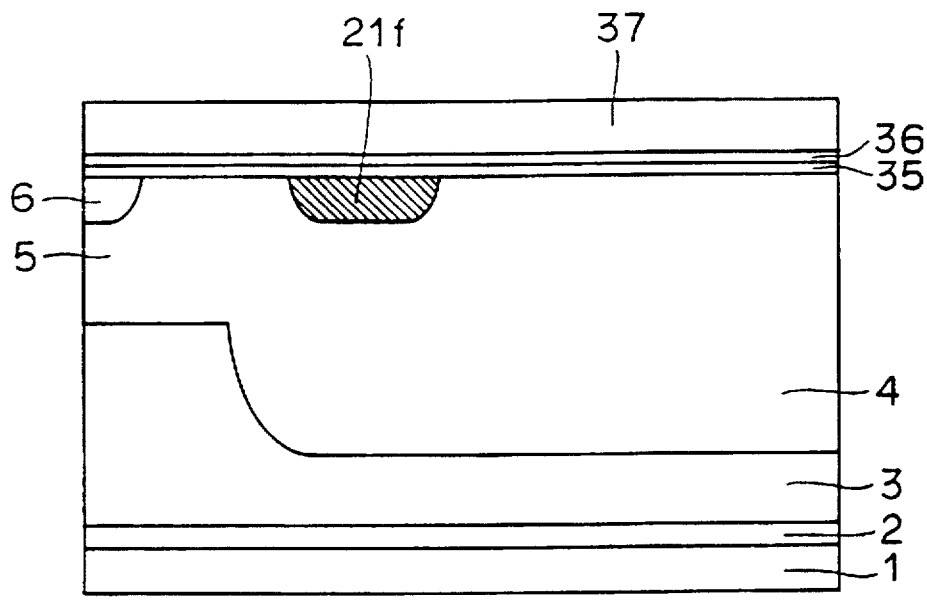
FIGS. 39 to 42 are cross sectional views showing first to fourth steps in a process of manufacturing an IGBT according to a seventh embodiment of the invention.

Referring to FIG. 39, through the same steps as the first embodiment, an n type emitter diffusion layer 6 and an n type diffusion region 21f are formed. A silicon oxide film 35 of a prescribed thickness is formed on a main surface of a silicon substrate by means for thermal oxidation or CVD. A silicon nitride film 36 of a prescribed thickness is formed on silicon oxide film 35 by CVD or the like. A silicon oxide film 37 is further formed on silicon nitride film 36 by CVD or the like.

Figure 40:
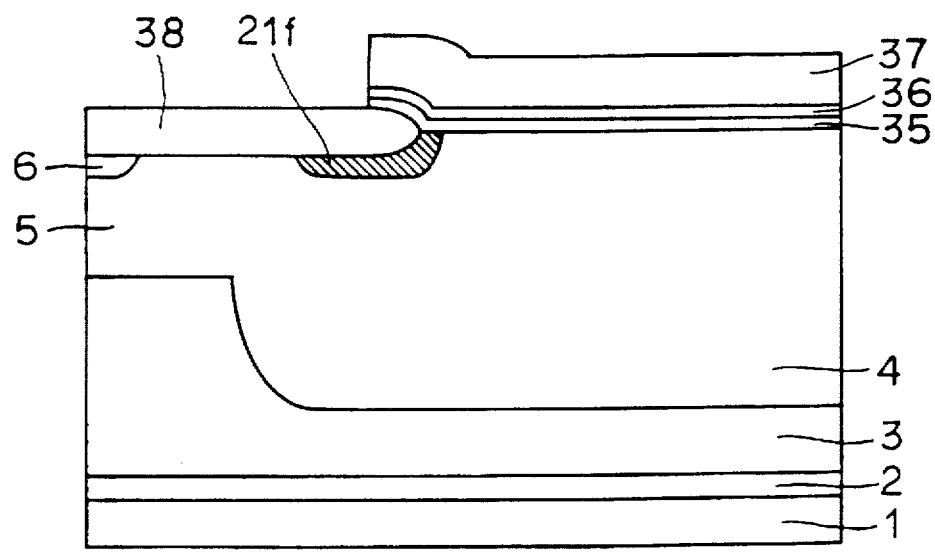

Referring to FIG. 40, silicon oxide films 35, 37 and silicon nitride film 36 are patterned into prescribed shapes by means of photolithography and etching. Then, a silicon oxide film 38 of a prescribed thickness is formed by LOCOS (Local Oxidation of Silicon).

Figure 41:
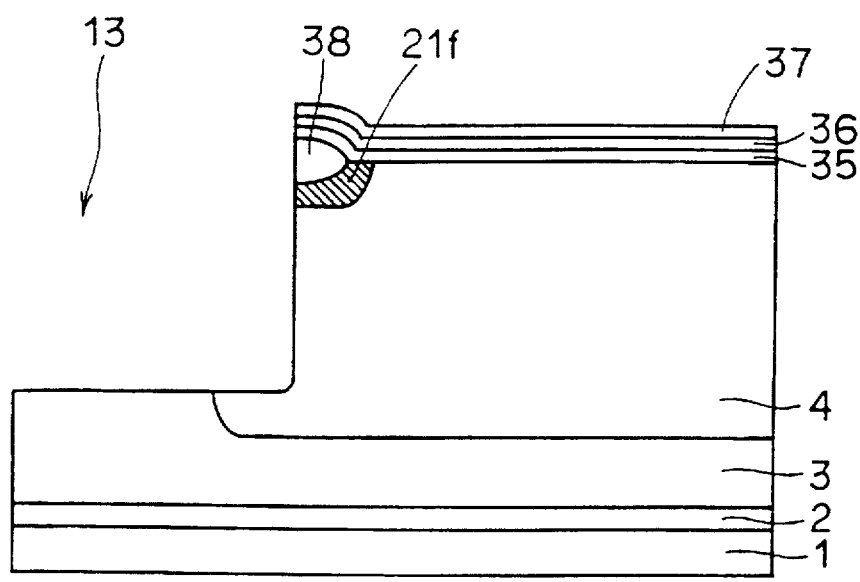

Referring to FIG. 41, silicon oxide films 38 and 37 are anisotropically etched. Silicon oxide film 38 is thus partially removed to selectively expose the main surface of the silicon substrate. At the time, silicon oxide film 37 is etched by the thickness of silicon oxide film 38, and thinned. Then, using remaining silicon oxide films 35, 37, 38 and silicon nitride film 36 as mask, the main surface of the silicon substrate is anisotropically etched. A trench 13 is thus formed.

Figure 42:
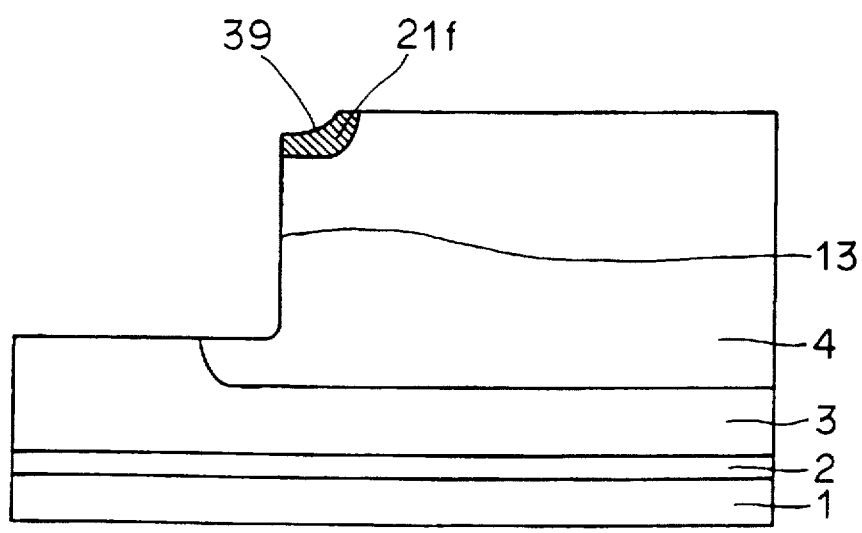

Referring to FIG. 42, remaining silicon oxide films 35, 37, 38 and silicon nitride film 36 are removed. A recess 39 is formed on the upper end corner portion of sidewall of trench 13. Then, the IGBT according to the embodiment will be completed through the same steps as the first embodiment.

Note that the structure obtained according to this embodiment is substantially identical to the IGBT according to the sixth embodiment shown in FIG. 29. Therefore, the same effect as the sixth embodiment is obtained.

Figure 43:
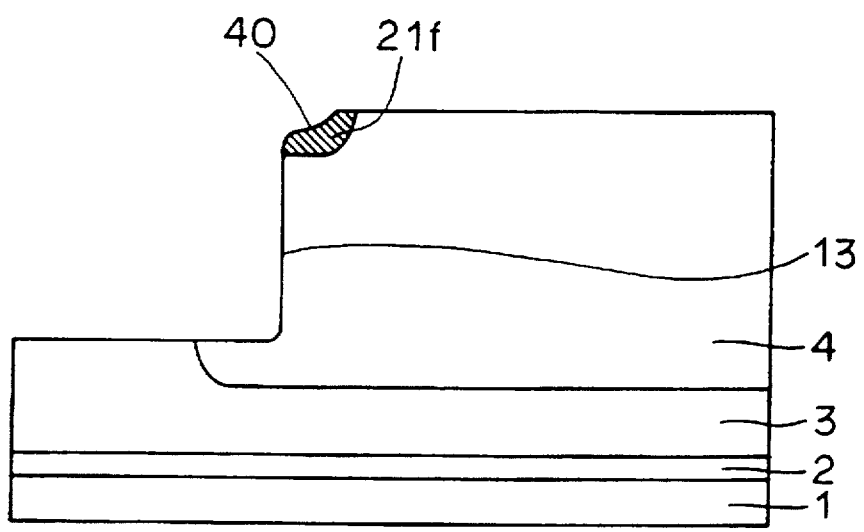
FIG. 43 is a cross sectional view showing steps characteristic to a variation of the method of manufacturing the IGBT according to the seventh embodiment of the invention.

A variation of the method of manufacturing the IGBT according to the seventh embodiment described above will be now described. FIG. 43 is a cross sectional view showing characteristic manufacturing steps in the variation of the method of manufacturing the IGBT according to the seventh embodiment.

Referring to FIG. 43, in the process of manufacturing the IGBT according to the seventh embodiment, after forming the recess 39, as is the case with the variation of the sixth embodiment, the entire main surface of the silicon substrate is subjected to ion beam etching using argon gas ions or the like. The tip end portion of the raised portion in the periphery of recess 39 is thus rounded.

Thereafter, the IGBT according to the variation is completed through the same steps as the first embodiment. Rounding the tip end of the raised portion in the periphery of recess 39 as in the variation makes it possible to improve the breakdown voltage of silicon oxide film 7 positioned on a recess 40 more than the case of the seventh embodiment.

In the seventh embodiment, the method of thickening silicon oxide film 7 on the upper end corner portion of the sidewall of trench 13 may be any method described in conjunction with each embodiment described above.

In the above embodiments, an impurity introduced in order to obtain the proliferous oxidation effect may be of at least one kind arbitrarily selected from As, P, B, $BF_2$, silicon ions and a material inert to silicon. Furthermore, if a substrate formed of a material other than silicon is used, ions of the material of the substrate or a substance inert to the material of the substrate may be selected as the impurity. Thus the same effect is obtained.

As in the foregoing, according to a semiconductor device having a trench structure according to the present invention, the thickness of an insulating layer positioned on the upper end corner portion on the sidewall of a trench is increased. Thus, the breakdown voltage of the insulating layer under the portion from which the conductive layer is led to the semiconductor substrate can be improved to a level about 1.6 times as large as a conventional case. Thus, a semiconductor device having a highly reliable trench structure is obtained. In addition, since the thickness of the insulating layer positioned on the upper end corner portion of the sidewall of the trench is increased in order to secure the breakdown voltage of the insulating layer at the portion, the curvature of the upper end corner portion of the sidewall or the trench does not have to be increased. It is therefore possible to improve the breakdown voltage of the insulating layer positioned on the upper end corner portion of the sidewall of the trench without increasing the size of the device.

According to a method of manufacturing a semiconductor device having a trench structure according to the present invention, an impurity implanted region is formed in a region close to the upper end corner portion of the sidewall of a trench. Thus, when an oxide film is formed of the by means of thermal oxidation treatment, the thickness of the oxide film is locally increased by the effect of proliferous oxidation in this impurity implanted region. At the time, since the proliferous oxidation effect is obtained by the presence of the impurity implanted region, a high temperature treatment is not necessary as opposed to a conventional case. Changes in the structure of the other impurity diffusion layers can therefore be restrained to a small level, and a semiconductor device having a trench structure with an improved breakdown voltage at the upper corner portion of sidewall of the trench is obtained. Another impurity diffusion layer to be formed in the semiconductor device can be formed simultaneously with the impurity implanted region by appropriately selecting an impurity. In such a case, the impurity implanted region and another impurity diffusion layer can be formed at a time by using an appropriately selected mask pattern form at the time of implanting the impurity. Thus, the impurity implanted region can be formed without increasing the number of manufacturing steps. As a result, without increase of the manufacturing cost, a semiconductor device having a trench structure with an improved breakdown voltage of an insulating layer at the upper end corner portion of sidewall of the trench is obtained.

According to a method of manufacturing a semiconductor device having a trench structure according to the present invention, in another aspect, after implanting an impurity into a main surface of a semiconductor substrate, the impurity is diffused. The diffusion treatment at the time is the same as a diffusion treatment of an impurity in order to form another impurity diffusion layer to be formed in the semiconductor device, the structure of that other impurity diffusion layer does not greatly change by the diffusion treatment. As is the case with the above aspect, the impurity region can be formed in the same step as that other impurity diffusion layer in the semiconductor device. Thus, without increasing the manufacturing cost, a semiconductor device having a trench structure having an improved breakdown voltage at the upper end corner portion of sidewall of a trench is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a trench structure, comprising the steps of:

forming an impurity implanted region by implanting an impurity into a prescribed region of a main surface of a semiconductor substrate;

forming a mask layer patterned into a prescribed shape so as to partially overlap said impurity implanted region on the main surface of said semiconductor substrate;

forming a trench penetrating through a part of said impurity implanted region by anisotropically etching the main surface of said semiconductor substrate using said mask layer as a mask;

removing said mask layer after forming said trench;

forming an oxide film on the entire main surface of said semiconductor substrate by thermally oxidizing the entire main surface of said semiconductor substrate so that the thickness of the oxide film positioned on an upper end corner portion of a sidewall of the trench is greater than the thickness of the oxide film positioned on the sidewall of the trench excluding the upper end corner portion; and forming a conductive layer on said oxide film extending from the inside of said trench onto the main surface of said semiconductor substrate, wherein said step of forming said trench includes a step of forming a recess having part of its bottom surface within said impurity implanted region by isotropic etching the main surface of said semiconductor substrate using said mask layer as a mask, before an anisotropic etching treatment for forming said trench.

2. A method of manufacturing a semiconductor device having a trench structure as recited in claim 1, wherein said step of removing said mask layer includes a step of subjecting an upper end corner portion of the sidewall of said trench to an ion beam etching treatment using inert gas ions after removing said mask layer.

3. A method of manufacturing a semiconductor device having a trench structure, comprising the steps of:

forming an impurity implanted region by implanting an impurity into a prescribed region of a main surface of a semiconductor substrate;

forming a mask layer patterned into a prescribed shape so as to partially overlap said impurity implanted region on the main surface of said semiconductor substrate;

forming a trench penetrating through a part of said impurity implanted region by anisotropically etching the main surface of said semiconductor substrate using said mask layer as a mask;

removing said mask layer after forming said trench;

forming an oxide film on the entire main surface of said semiconductor substrate by thermally oxidizing the entire main surface of said semiconductor substrate so that the thickness of the oxide film positioned on an upper end corner portion of a sidewall of the trench is greater than the thickness of the oxide film positioned on the sidewall of the trench excluding the upper end corner portion; and forming a conductive layer on said oxide film extending from the inside of said trench onto the main surface of said semiconductor substrate, wherein said step of forming said mask layer includes the steps of:

forming a first oxide film on the main surface of said semiconductor substrate;

forming a nitride film on said first oxide film;

forming a second oxide film on said nitride film;

forming said mask layer selectively exposing the main surface of said semiconductor substrate and partially overlapping an end region of said impurity implanted region by patterning said first oxide film, said nitride film and said second oxide film into prescribed shapes; and forming a third oxide film extending under said mask layer and having a part of its bottom surface within said impurity implanted region by selectively oxidizing the main surface of said semiconductor substrate using said mask layer as a mask, and said step of forming said trench includes the steps of:

selectively exposing the main surface of said semiconductor substrate by anisotropic etching of said mask layer and said third oxide film before forming said trench; and removing said mask layer and said third oxide film remaining under said mask layer after forming said trench.

4. A method of manufacturing a semiconductor device having a trench structure as recited in claim 3, wherein said step of removing said mask layer includes a step of rounding an upper end corner portion of the sidewall of said trench by subjecting the upper end corner portion of the sidewall of said trench to an ion beam etching treatment using inert gas ions after removing said mask layer.

* * * * *